(12) United States Patent
Nakagawa et al.

(10) Patent No.: US 7,294,571 B2
(45) Date of Patent: Nov. 13, 2007

(54) CONCAVE PATTERN FORMATION METHOD AND METHOD FOR FORMING SEMICONDUCTOR DEVICE

(75) Inventors: Hideo Nakagawa, Shiga (JP); Masaru Sasago, Osaka (JP); Yoshihiko Hirai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 359 days.

(21) Appl. No.: 11/098,371

(22) Filed: Apr. 5, 2005

(65) Prior Publication Data

US 2005/0170269 A1   Aug. 4, 2005

Related U.S. Application Data

(63) Continuation of application No. PCT/JP2004/008656, filed on Jun. 14, 2004.

(30) Foreign Application Priority Data

Jun. 20, 2003   (JP) ............................. 2003-175879

(51) Int. Cl.
H01L 21/44 (2006.01)
(52) U.S. Cl. .............................. 438/672; 257/E21.585; 257/E21.548
(58) Field of Classification Search ................ 438/672; 257/E21.585, E21.546, E21.548, E21.007
See application file for complete search history.

(56) References Cited

U.S. PATENT DOCUMENTS 5,772,905 A    6/1998   Chou

2005/0164494 A1*   7/2005   Nakagawa et al. ......... 438/637
2005/0170269 A1*   8/2005   Nakagawa et al. ........... 430/30

FOREIGN PATENT DOCUMENTS

| JP | 06-267943 A | 9/1994 |
| JP | 07-121914 A | 5/1995 |
| JP | 2000-194142 A | 7/2000 |
| JP | 2001-252927 A | 9/2001 |
| JP | 2002-158221 A | 5/2002 |
| JP | 2003-077807 A | 3/2003 |

OTHER PUBLICATIONS

Chou, Stephen Y., et al. "Imprint of sub-25 nm vias and trenches in polymers." Appl. Phys. Lett. 67 (21), Nov. 20, 1995, pp. 3114-3115.

* cited by examiner

*Primary Examiner*—Walter L Lindsay, Jr.
(74) *Attorney, Agent, or Firm*—McDermott Will & Emery LLP

(57) ABSTRACT

A pattern formation method includes the steps of forming a flowable film made of a material with flowability; forming at least one of a concave portion and a convex portion provided on a pressing face of a pressing member onto the flowable film by pressing the pressing member against the flowable film; forming a solidified film by solidifying the flowable film, onto which the at least one of a concave portion and a convex portion has been transferred, through annealing at a first temperature with the pressing member pressed against the flowable film; and forming a pattern made of the solidified film burnt by annealing at a second temperature higher than the first temperature.

10 Claims, 20 Drawing Sheets

CONCAVE PATTERN FORMATION METHOD AND METHOD FOR FORMING SEMICONDUCTOR DEVICE

REFERENCE TO RELATED APPLICATION

This Application is a continuation of International Application No. PCT/JP2004/008656, whose international filing date is Jun. 14, 2004, which in turn claims the benefit of Japanese Application No. 2003-175879, filed Jun. 20, 2003, the disclosures of which Applications are incorporated by reference herein. The benefit of the filing and priority dates of the International and Japanese Applications is respectfully requested.

BACKGROUND OF THE INVENTION

In a method for forming multilayered interconnects in formation process for semiconductor devices, with respect to a generation of a design rule of 130 nm or less, a damascene method in which a concave portion (a via hole or an interconnect groove) is formed in an insulating film, the concave portion is filled with a metal film principally by a metal plating method and the metal film is planarized by chemical mechanical polishing (CMP) is employed for forming a buried interconnect. In this case, as a method for forming a concave portion in an insulating film, apart from conventionally known dry etching, nano-imprint lithography proposed by S. Y. Chou, et al. in Non-patent Document 1 (Applied Physics Letter, Volume 67 (1995), pp. 3114-3116) or Patent Document 1 (U.S. Pat. No. 5,772,905 (Jun. 30, 1998)) is known.

Now, a conventional pattern formation method by using the nano-imprint lithography will be described with reference to FIGS. 17A through 17E.

First, as shown in FIG. 17A, a film 102A of a thermosetting resin is formed on a substrate (semiconductor wafer) 101 in a surface portion of which devices such as transistors and interconnects (not shown in the drawing) have been formed, and thereafter, as shown in FIG. 17B, a pressing face of a mold 103 having a convex portion 104 on the pressing face is pressed against the film 102A, so as to transfer the convex portion 104 of the mold 103 onto the film 102A.

Next, as shown in FIG. 17C, with a pressure applied to the mold 103, the substrate 101 is annealed for curing the film 102A, so as to form a cured film 102B. In the case where the film 102A is made of a photo-setting resin, the cured film 102B is formed through irradiation with light of UV or the like with a pressure applied to the mold 103.

Then, as shown in FIG. 17D, the mold 103 is moved away from the cured film 102B, and thus, a concave portion 105 is formed in the cured film 102B through the transfer of the convex portion 104 of the mold 103.

Next, the whole cured film 102B is subjected to anisotropic dry etching (anisotropic etch back), so as to remove a portion of the cured film 102B remaining on the bottom of the concave portion 105 as shown in FIG. 17E.

S. Y. Chou et al. use PMMA (polymethyl methacrylate), that is, a resist material, as the material for the film 102A, and after curing the PMMA once, the concave portion 105 is formed by pressing the mold 103 against the film 102A with the PMMA slightly softened through annealing at 200° C. In this case, since the PMMA has been cured, a high pressure as high as 140 atmospheric pressures is disadvantageously necessary for forming the concave portion 105.

Therefore, in order to overcome this disadvantage, according to Patent Document 2 (Japanese Laid-Open Patent Publication No. 2000-194142), a photo-setting material film made of a liquid photo-setting material is used as the film 102A and the film 102A is cured through annealing and light irradiation with the mold 103 pressed against the film 102A. Thus, the applied pressure is reduced to several atmospheric pressures, and hence, the accuracy in horizontal positions of the mold 103 and the substrate 101 is improved.

At this point, a method for forming a buried interconnect included in multilayered interconnects by the damascene method will be described. In general, a method for forming a buried plug or a buried interconnect alone by the damascene method is designated as a single damascene method, and a method for forming both a buried plug and a buried interconnect simultaneously by the damascene method is designated as a dual damascene method.

Now, a formation method for a semiconductor device in which a plug or a metal interconnect is formed by the single damascene method will be described with reference to FIGS. 18A through 18E.

First, as shown in FIG. 18A, an insulating film 112 of, for example, a silicon oxide film is formed on a substrate (semiconductor wafer) 111 by, for example, a chemical vapor deposition (CVD) method or a spin on dielectric (SOD) method.

Next, as shown in FIG. 18B, a resist pattern 113 having an opening for forming a via hole or an interconnect groove is formed on the insulating film 112 by lithography. Thereafter, as shown in FIG. 18C, the insulating film 112 is dry etched by using the resist pattern 113 as a mask, thereby forming a concave portion 114 corresponding to a via hole or an interconnect groove in the insulating film 112.

Then, as shown in FIG. 18D, after forming a barrier metal layer (not shown in the drawing) by, for example, a sputtering method, a copper film 115 is deposited on the barrier metal layer by, for example, a plating method.

Next, as shown in FIG. 18E, an unnecessary portion of the copper film 115, namely, a portion thereof exposed above the insulating film 112, is removed by chemical mechanical polishing (CMP), so as to form a plug or metal interconnect 116 made of the copper film 115.

Now, a formation method for a semiconductor device in which a plug and a metal interconnect are formed by the dual damascene method will be described with reference to FIGS. 19A through 19D and 20A through 20D. Herein, a process in which a plug and a metal interconnect are formed by forming a via hole before forming an interconnect groove and filling a metal film in the via hole and the interconnect groove, namely, what is called via first process, will be described.

First, as shown in FIG. 19A, an insulating film 122 of, for example, a silicon oxide film is formed on a substrate (semiconductor wafer) 121 by, for example, the chemical vapor deposition method or the spin on dielectric method.

Next, as shown in FIG. 19B, a first resist pattern 123 having an opening for forming a via hole is formed on the insulating film 122 by the lithography, and thereafter, as shown in FIG. 19C, the insulating film 122 is dry etched by using the first resist pattern 123 as a mask, thereby forming a via hole 124 in the insulating film 122.

Then, as shown in FIG. 19D, after forming a bottom antireflection coating (BARC) 125 on the insulating film 122 including the inside of the via hole 124, a second resist pattern 126 having an opening for forming an interconnect groove is formed on the bottom antireflection coating 125.

Next, as shown in FIG. 20A, the bottom antireflection coating 125 is dry etched by using the second resist pattern 126 as a mask, so as to allow a portion of the bottom antireflection coating 125 to remain in a lower portion of the via hole 124. Thereafter, the insulating film 122 is dry etched by using the second resist pattern 126 and the bottom antireflection coating 125 as a mask, thereby forming an interconnect groove 127 in the insulating film 122.

Subsequently, as shown in FIG. 20B, after removing the second resist pattern 126 and the bottom antireflection coating 125 by ashing and cleaning, a barrier metal layer (not shown in the drawing) is formed by the sputtering method. Thereafter, as shown in FIG. 20C, a copper film 128 is deposited on the barrier metal layer by the plating method, so as to fill the via hole 124 and the interconnect groove 127 with the copper film 128.

Next, an unnecessary portion of the copper film 128, namely, a portion thereof exposed above the insulating film 122, is removed by the chemical mechanical polishing. Thus, as shown in FIG. 20D, a plug 130 and a metal interconnect 131 made of the copper film 128 are formed at the same time.

SUMMARY OF THE INVENTION

An object of the invention is forming a pattern with a uniform structure of the basic skeleton and improved film quality in a small number of processes.

In order to achieve the object, the pattern formation method of this invention includes the steps of forming a flowable film made of a material with flowability; forming at least one of a concave portion and a convex portion provided on a pressing face of a pressing member onto the flowable film by pressing the pressing member against the flowable film; forming a solidified film by solidifying the flowable film, onto which the at least one of a concave portion and a convex portion has been transferred, through annealing of the flowable film at a first temperature with the pressing member pressed against the flowable film; and forming a pattern made of the solidified film burnt by annealing at a second temperature higher than the first temperature.

In the pattern formation method of this invention, after forming, onto the flowable film, at least one of the concave portion and the convex portion provided on the pressing face of the pressing member, the pattern is formed by solidifying and burning the flowable film. Therefore, the pattern can be formed through a small number of processes. Also, in the step of forming the solidified film by forming at least one of the concave portion and the convex portion onto the flowable film by pressing the pressing face of the pressing member against the flowable film, the annealing is performed at the first temperature that is a relatively low temperature, and thus, the basic skeleton of the solidified film (such as a polymer skeleton of an organic film, a siloxane skeleton of a silicon oxide film or an organic-inorganic film, or a resin skeleton of a resist film) is formed. Thereafter, in the step of forming the pattern, the annealing is performed at the second temperature that is a relatively high temperature, so as to vaporize porogen such as an acrylic polymer, a remaining solvent or the like from the solidified film. Therefore, as compared with the case where formation of a basic skeleton and vaporization of the porogen, a remaining solvent or the like are performed in parallel, the structure of the basic skeleton of the pattern is made uniform, resulting in improving the film quality of the pattern. Accordingly, in the case where the pattern is made of an insulating film, the dielectric constant is uniform within the whole film, and the insulating film attains high reliability.

In the pattern formation method of this invention, the first temperature is preferably approximately 150° C. through approximately 300° C.

Thus, the basic skeleton of the flowable film can be formed without vaporizing the porogen or the like included in the flowable film.

In the pattern formation method of this invention, the second temperature is preferably approximately 350° C. through approximately 450° C.

Thus, the porogen or the like can be vaporized from the solidified film without degrading the film quality of the solidified film and also the film quality of the pattern.

In the pattern formation method of this invention, the material with flowability may be an insulating material.

In the pattern formation method of this invention, the material with flowability is preferably in the form of a liquid or a gel.

Thus, the flowable film can be easily and definitely formed.

In the pattern formation method of this invention, in the step of forming a flowable film, the flowable film is preferably formed on a substrate by supplying the material with flowability onto the substrate rotated.

Thus, the thickness of the flowable film can be made uniform.

In the pattern formation method of this invention, in the step of forming a flowable film, the flowable film is preferably formed on a substrate by supplying the material with flowability onto the substrate and rotating the substrate after the supply.

Thus, the thickness of the flowable film can be made uniform.

In the pattern formation method of this invention, in the step of forming a flowable film, the flowable film is preferably formed on a substrate by supplying, in the form of a shower or a spray, the material with flowability onto the substrate rotated.

Thus, the flowable film with a comparatively small thickness can be definitely formed.

In the pattern formation method of this invention, in the step of forming a flowable film, the flowable film is preferably formed on a substrate by supplying the material with flowability from a fine spray vent of a nozzle onto the substrate with the nozzle having the fine spray vent and the substrate relatively moved along plane directions.

Thus, the thickness of the flowable film can be controlled to be a desired thickness by adjusting the relative moving rates of the nozzle and the substrate. Also, the degree of the flowability of the flowable film can be changed by adjusting the viscosity of the material with flowability. Furthermore, the process speed can be controlled by adjusting the number of nozzles.

In the pattern formation method of this invention, in the step of forming a flowable film, the flowable film is preferably formed on a substrate by supplying the material with flowability having been adhered to a surface of a roller onto the substrate with the roller rotated.

Thus, the thickness of the flowable film can be controlled by adjusting a distance between the roller and the substrate and a force for pressing the roller against the substrate. Also, a material with flowability and high viscosity can be used.

The pattern formation method of this invention preferably further includes, between the step of forming a flowable film and the step of forming at least one of a concave portion and a convex portion onto the flowable film, a step of selectively removing a peripheral portion of the flowable film.

Thus, the peripheral portion of the substrate can be mechanically held in the process for forming the pattern with ease.

In the case where the pattern formation method of this invention includes the step of selectively removing a peripheral portion of the flowable film, this step is preferably performed by supplying a solution for dissolving the material with flowability onto the peripheral portion of the flowable film with the flowable film rotated.

Thus, the flowable film can be definitely removed from a peripheral portion of a substrate in the plane shape of a circle or a polygon with a large number of vertexes.

In the case where the pattern formation method of this invention includes the step of selectively removing a peripheral portion of the flowable film, this step is preferably performed by modifying the peripheral portion of the flowable film through irradiation with light and removing the modified peripheral portion.

Thus, the flowable film can be definitely removed from a peripheral portion of a substrate not only in the plane shape of a circle or a polygon with a large number of vertexes but also in the shape of a polygon with a small number of vertexes such as a triangle or a rectangle.

In the pattern formation method of this invention, it is preferred that the flowable film is formed on a substrate, and that in the step of forming at least one of a concave portion and a convex portion onto the flowable film, a plurality of distances between a surface of the substrate and the pressing face are measured, and the flowable film is pressed with the pressing face in such a manner that the plurality of distances are equal to one another.

In the case where a plurality of distances between the surface of the substrate or the stage and the pressing face are measured in the pattern formation method of this invention, the plurality of distances are preferably measured by measuring capacitance per unit area in respective measurement positions.

Thus, the plural distances can be easily and definitely measured.

Thus, a distance of the surface of the flowable film from the surface of the substrate can be always made uniform, and therefore, an operation for making uniform a distance between the surface of the substrate and the pressing face of the pressing member every given period of time can be omitted.

In the pattern formation method of this invention, it is preferred that the flowable film is formed on a substrate, and that in the step of forming at least one of a concave portion and a convex portion onto the flowable film, a plurality of distances between a surface of a stage where the substrate is placed and the pressing face are measured, and the flowable film is pressed with the pressing face in such a manner that the plurality of distances are equal to one another.

Thus, a distance of the surface of the flowable film from the surface of the substrate can be always made uniform, and therefore, an operation for making uniform a distance between the surface of the substrate and the pressing face of the pressing member every given period of time can be omitted.

In the pattern formation method of this invention, the pressing face of the pressing member preferably has a hydrophobic property.

Thus, the pressing member can be easily moved away from the solidified film, and hence, a pattern with fewer defects can be formed.

In the pattern formation method of this invention, it is preferred that the material with flowability is a photo-setting resin, and that the step of forming a solidified film includes a sub-step of irradiating the flowable film with light.

Thus, the flowable film can be easily and rapidly solidified through a photochemical reaction and a thermal chemical reaction.

In the pattern formation method of this invention, the material with flowability may be an organic material, an inorganic material, an organic-inorganic material, a photo-setting resin or a photosensitive resin.

In the pattern formation method of this invention, the pattern is preferably a porous film.

Thus, a pattern with a low dielectric constant can be formed.

In the pattern formation method of this invention, in the step of forming a pattern, the solidified film is preferably annealed at the second temperature with the pressing face pressed against the solidified film.

Thus, the shape of at least one of the concave portion and the convex portion formed in the solidified film can be highly accurately kept.

In the pattern formation method of this invention, in the step of forming a pattern, the solidified film is preferably annealed at the second temperature with the pressing face moved away from the solidified film.

Thus, the porogen, the remaining solvent or the like included in the solidified film can be easily vaporized.

The method for forming a semiconductor device of this invention includes the steps of forming a flowable film made of an insulating material with flowability; forming a convex portion provided on a pressing face of a pressing member onto the flowable film by pressing the pressing member against the flowable film; forming a solidified film by solidifying the flowable film, onto which the convex portion has been transferred, through annealing at a first temperature with the pressing member pressed against the flowable film; forming a pattern having a concave portion in the shape corresponding to the convex portion and made of the solidified film burnt by annealing at a second temperature higher than the first temperature; and forming at least one of a metal interconnect and a plug made of a metal material by filling the concave portion with a conductive material.

In the method for forming a semiconductor device of this invention, as described with respect to the pattern formation method, after forming, onto the flowable film, the convex portion provided on the pressing face of the pressing member, the pattern is formed by solidifying and burning the flowable film. Therefore, the pattern can be formed through a small number of processes. Also, in the step of forming the solidified film, the basic skeleton of the solidified film is formed, and thereafter, in the step of forming the pattern, porogen such as an acrylic polymer, a remaining solvent or the like is vaporized from the solidified film. Therefore, the structure of the basic skeleton of the pattern is made uniform, resulting in improving the film quality of the pattern. Accordingly, the dielectric constant of the insulating film of the pattern is made uniform in the whole film, so that the reliability of the insulating film and also the reliability of the semiconductor device can be improved.

In the case where the concave portion of the pattern corresponds to an interconnect groove or a hole, a metal interconnect or a plug made of the metal material is formed by the single damascene method, and in the case where the concave portion of the pattern corresponds to an interconnect groove and a hole, a metal interconnect and a plug made of the metal material are formed by the dual damascene method.

In the method for forming a semiconductor device of this invention, the first temperature is preferably approximately 150° C. through approximately 300° C.

Thus, the basic skeleton of the flowable film can be formed without vaporizing the porogen or the like included in the flowable film.

In the method for forming a semiconductor device of this invention, the second temperature is preferably approximately 350° C. through approximately 450° C.

Thus, the porogen or the like can be vaporized from the solidified film without degrading the film quality of the solidified film and also the film quality of the pattern.

In the method for forming a semiconductor device of this invention, it is preferred that the material with flowability is a photo-setting resin, and that the flowable film is solidified by irradiating the flowable film with light.

Thus, the flowable film can be easily and rapidly solidified through a photochemical reaction and a thermal chemical reaction.

In the method for forming a semiconductor device of this invention, the material with flowability may be an organic material, an inorganic material, an organic-inorganic material, a photo-setting resin or a photosensitive resin.

In the method for forming a semiconductor device of this invention, in the step of forming a pattern, the solidified film is preferably annealed at the second temperature with the pressing face pressed against the solidified film.

Thus, the shape of irregularities formed in the solidified film can be highly accurately kept.

In the method for forming a semiconductor device of this invention, in the step of forming a pattern, the solidified film is preferably annealed at the second temperature with the pressing face moved away from the solidified film.

Thus, the porogen, the remaining solvent or the like included in the solidified film can be easily vaporized.

In the method for forming a semiconductor device of this invention, the pattern is preferably a porous film.

Thus, an insulating film made of the pattern with a low dielectric constant can be formed.

In the method for forming a semiconductor device of this invention, the pattern preferably has a dielectric constant of approximately 4 or less.

Thus, the dielectric constant of the insulating film can be definitely lowered, so as to reduce capacitance between metal interconnects.

The method for forming a semiconductor device of this invention preferably further includes, after the step of forming a pattern and before the step of forming at least one of a metal interconnect and a plug, a step of removing a portion of the pattern remaining on a bottom of the concave portion by etching.

Thus, a hole or an interconnect groove made of the concave portion free from a remaining portion in the bottom thereof can be realized.

Furthermore, this invention provides one solution for the problem that the cost of the formation process for the semiconductor device is high because the number of processes is large, when multilayered interconnects are formed by the damascene method.

In another way, the nano-imprint lithography is applied instead of a combination of the resist pattern formation by the lithography and the dry etching, so as to reduce the number of processes for lowering the cost, in the process for forming a concave portion (a via hole or an interconnect groove) in an insulating film.

In the case where the nano-imprint lithography is applied to an insulating film to be used as an interlayer insulating film, in order to secure stability of the insulating film in semiconductor formation process performed thereafter, a process for curing the insulating material by annealing it at a temperature of approximately 400° C. is generally necessary.

The conventional nano-imprint lithography is, however, carried out for forming a resist pattern, and hence, the annealing temperature is approximately 200° C. at most.

If the insulating material is annealed at a temperature of approximately 350° C. or more for applying the insulating film to the nano-imprint lithography for forming a concave portion, the structure of the basic skeleton of the insulating film becomes locally ununiform, and hence, the film quality is degraded in such a manner that the dielectric constant of the insulating film is locally varied.

Therefore, this invention provides one solution for the problem that the performance and the reliability of the semiconductor device are largely degraded because of insufficient reliability of an insulating film.

DESCRIPTION OF THE EMBODIMENTS

Embodiment 1

A pattern formation method according to Embodiment 1 will now be described with reference to FIGS. 1A through 1E.

Figure 1A:
FIGS. 1A through 1E are cross-sectional views for showing procedures in a pattern formation method according to Embodiment 1.

First, as shown in FIG. 1A, a material with flowability, such as a material in the form of a liquid or a gel, is supplied onto a substrate 11 of a semiconductor wafer, so as to form a film with flowability (hereinafter simply referred to as a flowable film) 12A. In general, annealing is performed at approximately 80° C. through 120° C. in order to vaporize a part or most of a solvent included in the flowable film 12A formed on the substrate 11. This annealing is generally designated as pre-bake, and the temperature of the pre-bake may be set so that the flowability of the flowable film 12A can be kept in a transfer process subsequently performed. Specifically, the temperature may be set in accordance with the characteristics (such as the boiling point) of the solvent used for supplying the material with flowability, and the pre-bake may be omitted in some cases.

The flowable film 12A may be, for example, an organic film, an inorganic film, an organic-inorganic film (organic-inorganic hybrid film), a photo-setting resin film that is cured through irradiation with light, a photosensitive resin film such as a resist film, a porous film having a large number of pores with a diameter of approximately 1 nm through 10 nm therein, or the like.

A method for forming the flowable film 12A may be a spin coating method, a microscopic spraying method, a rotation roller method or the like, the thickness of the flowable film 12A is adjusted differently depending upon the employed method, and the film thickness can be adjusted by selecting the method for forming the flowable film 12A. The method for forming the flowable film 12A will be described in detail in Examples 1 through 4 below.

The plane shape of the substrate 11 is not particularly specified and may be any shape including a circle, a polygon and the like.

In the case where the flowable film 12A is used as an interlayer film of multilayered interconnects, the material with flowability is preferably an insulating material.

Figure 1B:
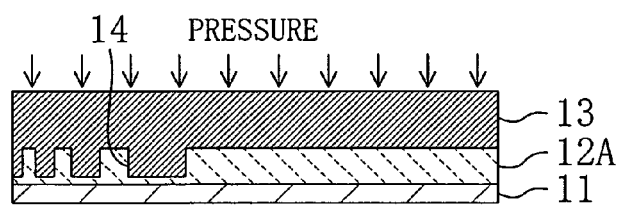

Next, as shown in FIG. 1B, a pressing face of a pressing member 13, which has the flat pressing face with irregularities thereon, is opposed to the surface of the flowable film 12A, and thereafter, a pressure toward the substrate is applied to the pressing member 13. Thus, the irregularities are transferred onto the surface of the flowable film 12A and the whole top face of the flowable film 12A excluding the transferred irregularities is planarized. In FIG. 1B, a reference numeral 14 denotes a convex portion provided on the pressing face.

In this case, merely by pressing the flowable film 12A with the pressing face of the pressing member 13, the whole top face of the flowable film 12A excluding the transferred irregularities is planarized. However, when the press with the pressing member 13 is intermitted, the flowable film 12A is changed into an energetically stable shape owing to the surface tension of the flowable film 12A.

Figure 1C:
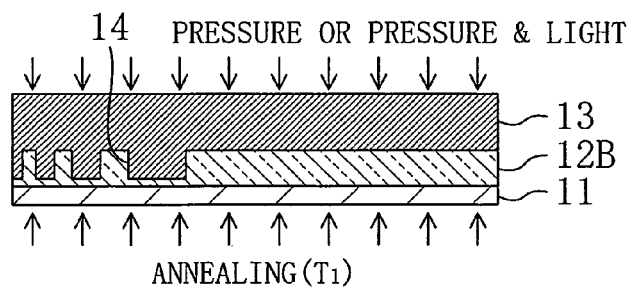

Therefore, as shown in FIG. 1C, with the pressing member 13 pressed against the flowable film 12A, the flowable film 12A is annealed at a first temperature (T1) so as to cause a chemical reaction within the flowable film 12A. Thus, the flowable film 12A is solidified, thereby forming a solidified film 12B made of the flowable film 12A and having the transferred irregularities. The first temperature (T1) is preferably approximately 150° C. through approximately 300° C. and is more preferably approximately 200° C. through approximately 250° C. In this manner, the basic skeleton of the flowable film 12A, such as a polymer skeleton or a siloxane skeleton, is definitely formed. In the solidifying process, the annealing is performed with a hot plate set to a desired temperature for approximately 2 through 3 minutes.

Figure 1D:
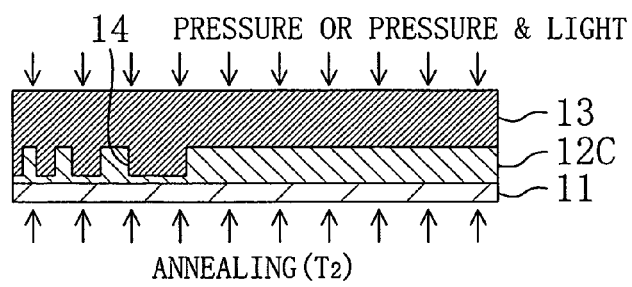

Next, as shown in FIG. 1D, with the pressing member 13 pressed against the solidified film 12B, the solidified film 12B is annealed at a second temperature (T2) higher than the first temperature (T1) for burning the solidified film 12B. Thus, a pattern 12C made of the burnt solidified film 12B is formed. The second temperature (T2) is preferably approximately 350° C. through approximately 450° C. In this manner, porogen and the like are vaporized from the solidified film 12B where the basic skeleton has been formed, and hence, the pattern 12C with a uniform film quality can be obtained. In the pattern formation process, the annealing is performed with a hot plate set to a desired temperature for approximately 2 through approximately 15 minutes.

Figure 1E:
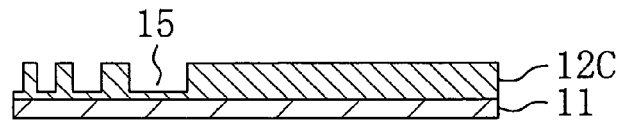

Next, after lowering the temperature of the pattern 12C to a temperature range between approximately 100° C. and room temperature, the pressing member 13 is moved away from the pattern 12C, and thereafter, the temperature of the pattern 12C is ultimately lowered to room temperature. Thus, as shown in FIG. 1E, the pattern 12C that has a concave portion 15 formed through the transfer of the convex portion 14 of the pressing member 13 and is flat in the whole top face excluding the concave portion 15 is obtained.

In order to provide the pressing face having the irregularities of the pressing member 13 with a hydrophobic property, the pressing face is preferably subjected to a Teflon (registered trademark) coating treatment or a surface treatment with a silicon coupling material. Thus, the pressing member 13 can be easily moved away from the pattern 12C, and hence, the pattern 12C with fewer defects can be formed.

In the case where the irregularities provided on the pressing face of the pressing member 13 is a convex portion in the shape of a column (dot), a hole is formed in the pattern 12C, and in the case where it is a convex portion in the shape of a line, an interconnect groove is formed in the pattern 12C. On the contrary, in the case where the irregularities provided on the pressing face of the pressing member 13 is a concave portion in the shape of a hole, a convex portion in the shape of a column (dot) is formed in the pattern 12C, and in the case where it is a convex portion in the shape of a groove, a line is formed in the pattern 12C.

Now, materials with flowability will be described.

The material with flowability used for forming an organic film is, for example, an aromatic polymer having aryl ether as a principal skeleton, and specific examples are FLARE and GX-3 (manufactured by Honeywell) and SiLK (manufactured by Dow Chemical).

The material with flowability used for forming an inorganic film is, for example, HSQ (hydrogen silsquioxane) or organic SOG such as an alkylsiloxane polymer, and a specific example of the HSQ is Fox (manufactured by Dow Corning) and a specific example of the organic SOG is HSG-RZ25 (manufactured by Hitachi Chemical Co., Ltd.).

The material with flowability used for forming an organic-inorganic film is, for example, organic siloxane having an organic group such as a methyl group in a siloxane skeleton, and a specific example is HOSP (hybrid organic siloxane polymer) (manufactured by Honeywell).

The material with flowability used for forming a photosetting resin film is, for example, PDGI (polydimethyl glutarimide), and a specific example is SAL101 (manufactured by Shipley Far East).

The material with flowability used for forming a photosensitive resin film may be a general resist material used in the lithography.

The material with flowability used for forming a porous film is, for example, an organic, inorganic or organic-inorganic material having pores, a specific example of the organic material having pores is Porous FLARE (manufactured by Honeywell), a specific example of the inorganic material having pores is XLK (manufactured by Dow Corning) having pores in HSQ (hydrogen silsquioxane), and specific examples of the organic-inorganic material having pores are Nanoglass (manufactured by Honeywell) and LKD-5109 (manufactured by JSR).

When the pattern 12C obtained by solidifying and burning the flowable film 12A made of any of the aforementioned materials is used as an interlayer insulating film of multi-layered interconnects, an interlayer insulating film that is dense and has a lower dielectric constant than a general silicon oxide film (with a dielectric constant of approximately 4) can be obtained. Therefore, a film suitable to a semiconductor device refined to 100 nm or less can be realized. In particular, when a porous film is used, an interlayer insulating film with a very low dielectric constant of 2 or less can be realized.

Although the aforementioned materials are materials for an insulating film, the present invention is applicable not only to a method for forming an insulating film but also to a method for forming a conductive polymer film or metal film.

Embodiment 2

A pattern formation method according to Embodiment 2 of the invention will now be described with reference to FIGS. 2A through 2E.

Since the basic process sequence of Embodiment 2 is almost the same as that of Embodiment 1, a difference from that of Embodiment 1 will be principally described below.

Figure 2A:
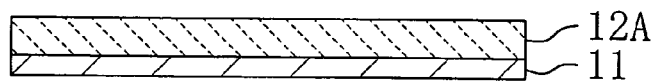
FIGS. 2A through 2E are cross-sectional views for showing procedures in a pattern formation method according to Embodiment 2.
Figure 2B:
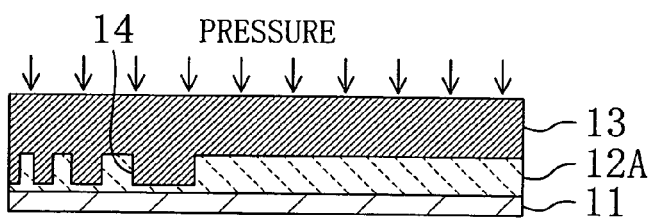

First, in the same manner as in Embodiment 1, a flowable film 12A is formed on a substrate 11 as shown in FIG. 2A. Thereafter, as shown in FIG. 2B, a pressing member 13 is pressed against the flowable film 12A, so as to transfer irregularities of the pressing face onto the flowable film 12A and planarize the whole top face of the flowable film 12A excluding the transferred irregularities.

Figure 2C:
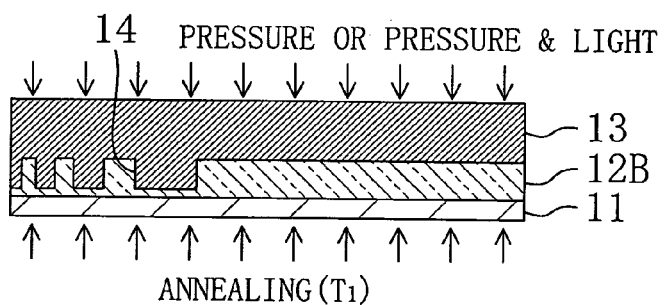

Next, as shown in FIG. 2C, with the pressing member 13 pressed against the flowable film 12A, the flowable film 12A is annealed at a first temperature (T1), so as to cause a chemical reaction within the flowable film 12A. Thus, the flowable film 12A is solidified, thereby forming a solidified film 12B having the transferred irregularities and a flat top face.

Figure 2D:
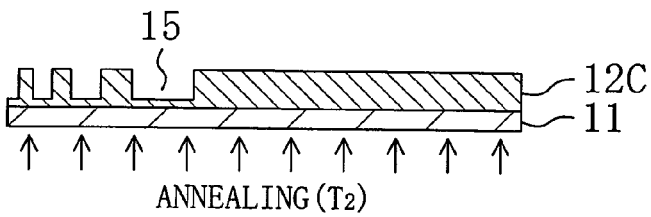
Figure 2E:
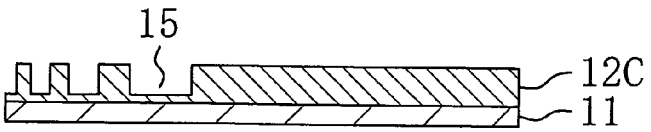

Then, as shown in FIG. 2D, after moving the pressing member 13 away from the solidified film 12B, the solidified film 12B is annealed at a second temperature (T2) higher than the first temperature (T1) for burning the solidified film 12B, thereby forming a pattern 12C made of the burnt solidified film 12B. Thereafter, the temperature of the pattern 12C is lowered to approximately room temperature. In this manner, as shown in FIG. 2E, the pattern 12C having a concave portion 15 formed through the transfer of a convex portion 14 of the pressing member 13 is formed.

A difference between Embodiment 1 and Embodiment 2 is that the solidified film 12B is burnt with the pressing face of the pressing member 13 pressed against the solidified film 12B in Embodiment 1 while it is burnt with the pressing face of the pressing member 13 moved away from the solidified film 12B in Embodiment 2. Accordingly, in Embodiment 2, it is necessary to perform the annealing with a hot plate in the solidifying process but the annealing can be performed with a hot plate or a furnace in the burning process.

Embodiment 2 is more effective than Embodiment 1 in the case where a solidified film largely outgassing is annealed in the burning process (the process for forming a pattern). In a general film, the concentration of a remaining solvent in the film can be controlled through the pre-bake, and therefore, the film minimally outgases in the burning process, but depending upon the composition of the film, it may outgas in the burning process where the annealing is performed at a comparatively high temperature. In such a case, there may arise a problem of uniformity or stability of the pattern 12C when the burning process of Embodiment 1 is performed, and hence, the burning process of Embodiment 2 is preferably performed. In particular, this effect is exhibited when the pattern 12C is a porous film. In a porous film, most of the basic structure of the film is formed through the annealing performed at the first temperature (T1) in the solidifying process, and a pore forming material added for forming pores is vaporized through the annealing performed at the second temperature (T2) in the burning process. Therefore, the burning process of Embodiment 2 in which the film is burnt with the pressing member 13 moved away from the solidified film 12B is suitable. Even in a porous film, if it is such an optimal film in which the basic skeleton of the film is formed and most of a pore forming material is vaporized in the solidifying process, a good pattern 12C can be obtained even by employing the burning process of Embodiment 1.

In Embodiment 1 or 2, the annealing temperature of the burning process (the second temperature) is set to be higher than the annealing temperature of the solidifying process (the first temperature). In the case where the pattern 12C is used as an insulating film of a semiconductor device, the annealing temperature of the solidifying process (the first temperature) is preferably approximately 150° C. through 300° C., and the annealing temperature of the burning process (the second temperature) is preferably approximately 350° C. through 450° C.

Next, a difference between a conventional pattern formation method and the present pattern formation method will be described with reference to FIGS. 3A and 3B.

Figure 3A:
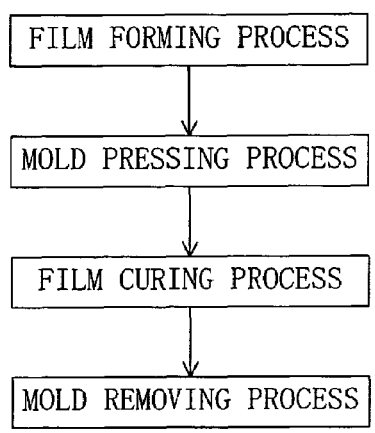
FIG. 3A is a flowchart for showing a sequence of a conventional pattern formation method and FIG. 3B is a flowchart for showing a sequence of the pattern formation method of Embodiment 1 or 2.
Figure 3B:
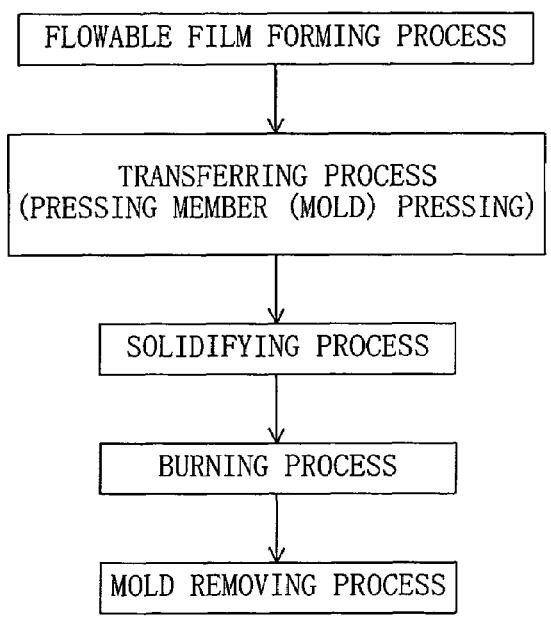

As shown in FIG. 3A, in the conventional pattern formation method, a film having irregularities is formed through one annealing in a film curing process performed after pressing a pressing member (a mold). On the contrary, as shown in FIG. 3B, in the present pattern formation method, after pressing the pressing member (a mold) (after the transferring process), a pattern 12C having transferred irregularities is formed through the annealing performed in the two stages in the solidifying process and the burning process.

EXAMPLE 1

As a method for forming a flowable film used in Embodiment 1 or 2, a first spin coating method will now be described with reference to FIGS. 4A through 4C.

Figure 4A:
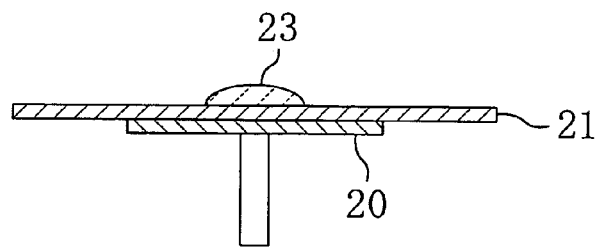
FIGS. 4A through 4C are cross-sectional views for showing procedures in Example 1 employed in the pattern formation method of Embodiment 1 or 2.

First, as shown in FIG. 4A, after holding a substrate 21 through vacuum adsorption on a rotatable stage 20, an appropriate amount of material 23 with flowability is dropped on the substrate 21, and thereafter, the stage 20 is rotated. Alternatively, as shown in FIG. 4B, after holding a substrate 21 through vacuum adsorption on a rotatable stage 20, a material 23 with flowability is supplied from a dropping nozzle 24 onto the substrate 21 while rotating the stage 20 together with the substrate 21.

Figure 4B:
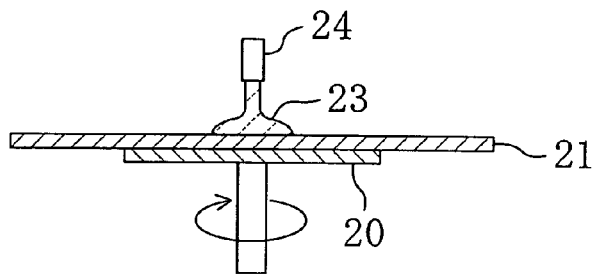
Figure 4C:
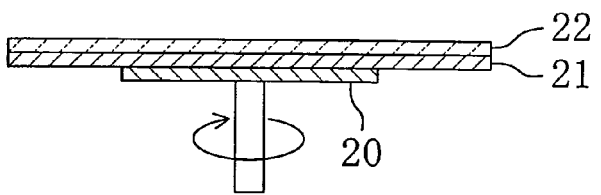

In this manner, a flowable film 22 is formed on the substrate 21 as shown in FIG. 4C.

In either of the method shown in FIG. 4A and the method shown in FIG. 4B, when the viscosity of the material 23 with flowability and the rotation speed of the stage 20 are optimized, the flowable film 22 can attain hardness suitable for the process for transferring the irregularities of the pressing member 13 (see FIG. 1B or 2B) onto the flowable film 22.

It is noted that the method of Example 1 is suitable to a case where the flowable film 22 is formed in a comparatively large thickness.

EXAMPLE 2

As a method for forming a flowable film used in Embodiment 1 or 2, a second spin coating method will now be described with reference to FIGS. 5A and 5B.

Figure 5A:
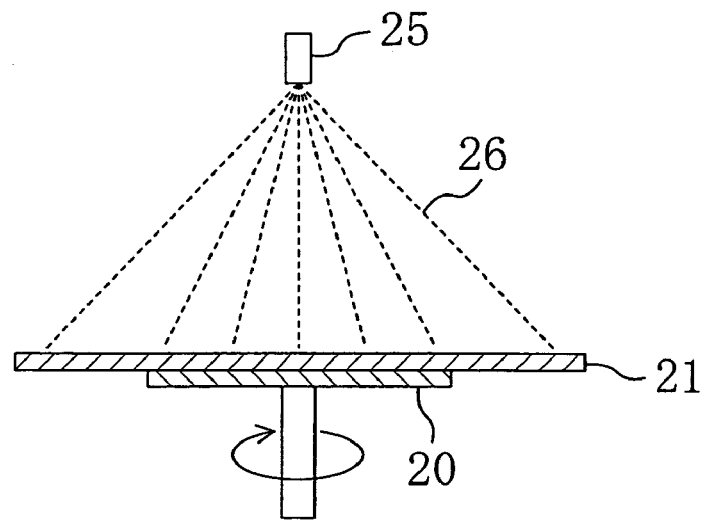
FIGS. 5A and 5B are cross-sectional views for showing procedures in Example 2 employed in the pattern formation method of Embodiment 1 or 2.
Figure 5B:
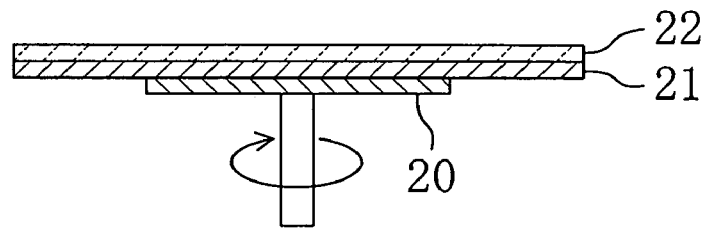

First, as shown in FIG. 5A, after holding a substrate 21 through vacuum adsorption on a rotatable stage 20, a material 26 with flowability is supplied in the form of a shower or spray from a spray nozzle 25 onto the substrate 21 while rotating the stage 20 together with the substrate 21.

After supplying a desired amount of material 26 with flowability, the stage 20 is continuously rotated for a predetermined period of time. Thus, a flowable film 22 is formed on the substrate 21 as shown in FIG. 5B.

The method of Example 2 is suitable to a case where the flowable film 22 is formed in a comparatively small thickness.

EXAMPLE 3

As a method for forming the flowable film used in Embodiment 1 or 2, a microscopic spraying method will now be described with reference to FIGS. 6A and 6B.

Figure 6A:
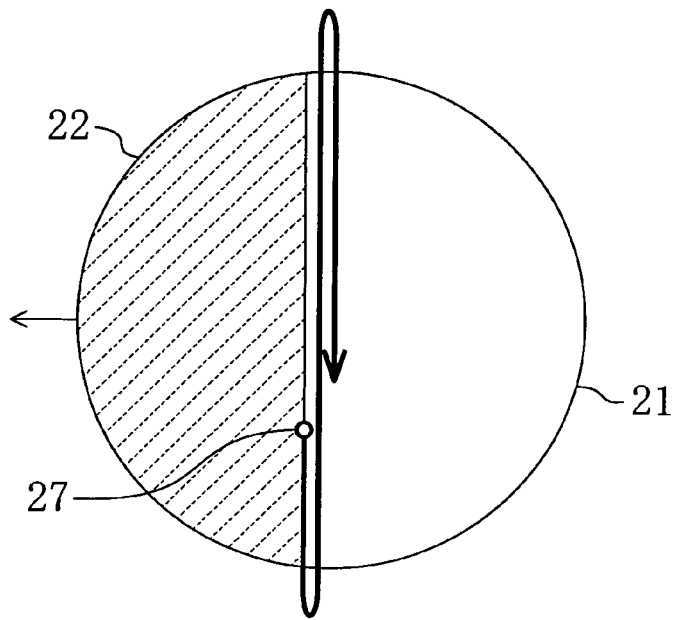
FIGS. 6A and 6B are cross-sectional views for showing procedures in Example 3 employed in the pattern formation method of Embodiment 1 or 2.

First, as shown in FIG. 6A, a material 28 with flowability is supplied from a dropping nozzle 27 onto a substrate 21 by a given amount at a time while moving the substrate 21 along one of the two perpendicular directions of the two-dimensional rectangular coordinate system, for example, along the lateral direction of FIG. 6A and moving the dropping nozzle 27 along the other of the two perpendicular directions, for example, along the longitudinal direction of FIG. 6A. In other words, an operation for moving the substrate 21 by a given distance toward the leftward direction in FIG. 6A and stopping it is repeatedly performed, and while the substrate 21 is stopped, the material 28 with flowability is supplied from the dropping nozzle 27 onto the substrate 21 by a given amount at a time while moving the dropping nozzle 27 along the longitudinal direction in FIG. 6A.

Figure 6B:
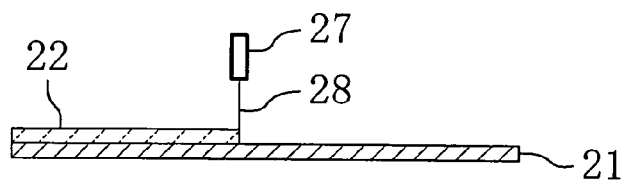

In this manner, a flowable film 22 is formed on the substrate 21 as shown in FIG. 6B.

In the method of Example 3, the thickness of the flowable film 22 can be controlled over a range from a small thickness to a large thickness by adjusting the amount of material 28 with flowability supplied from the dropping nozzle 27 and the moving rate of the dropping nozzle 27.

Also, the degree of the flowability of the flowable film 22 can be changed by adjusting the viscosity of the material 28 with flowability supplied from the dropping nozzle 27.

Furthermore, the process speed can be controlled by adjusting the number of dropping nozzles 27.

EXAMPLE 4

As a method for forming a flowable film used in Embodiment 1 or 2, a rotation roller method will now be described with reference to FIGS. 7A and 7B.

Figure 7A:
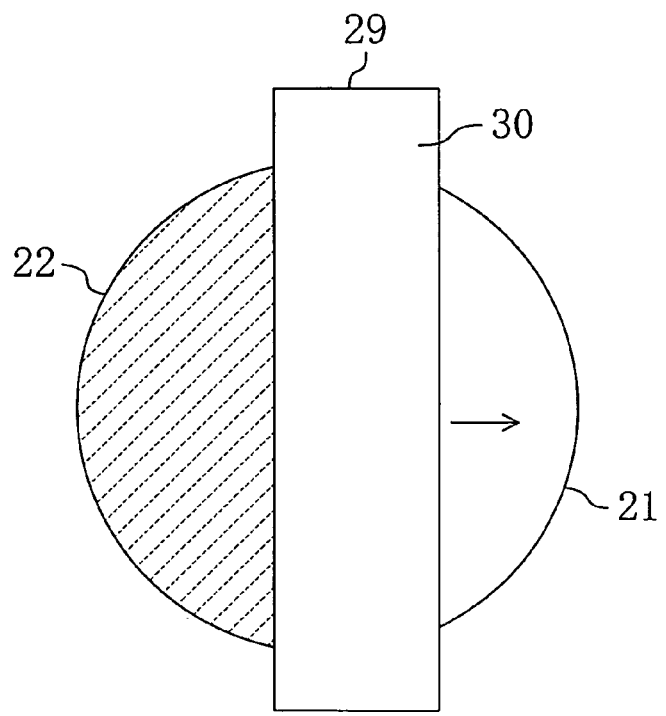
FIGS. 7A and 7B are cross-sectional views for showing procedures in Example 4 employed in the pattern formation method of Embodiment 1 or 2.
Figure 7B:
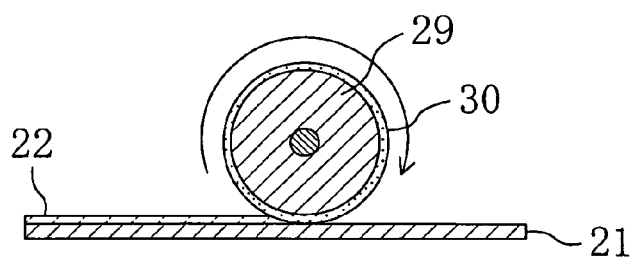

As shown in FIGS. 7A and 7B, with a material 30 with flowability uniformly adhered onto the peripheral face of a rotation roller 29, the rotation roller 29 is rotationally moved on the surface of a substrate 21.

In this manner, the material 30 with flowability is adhered onto the surface of the substrate 21, and hence, a flowable film 22 is formed on the substrate 21 as shown in FIG. 7B.

In the method of Example 4, the thickness of the flowable film 22 can be controlled by adjusting the distance between the rotation roller 29 and the substrate 21 and a force for pressing the rotation roller 29 against the substrate 21.

Also, the method of Example 4 is suitable to a case where the material 30 with flowability is in the form of a highly viscous liquid or a gel.

Embodiment 3

A pattern formation method according to Embodiment 3 will now be described with reference to FIGS. 8A through 8C and 9A through 9C.

In Embodiment 3, methods for selectively removing a peripheral portion of the flowable film obtained in Embodiment 1 or 2 are described. Specifically, in a first method, the peripheral portion is removed by supplying a solution for dissolving the flowable film to the peripheral portion of the flowable film while rotating the substrate on which the flowable film is formed, and in a second method, the peripheral portion of the flowable film is modified by irradiating the peripheral portion with light and thereafter the modified peripheral portion is removed.

In Embodiment 1 or 2, the flowable film is formed over the whole surface of the substrate, namely, also on a peripheral portion of the substrate. However, it is sometimes necessary to mechanically hold the peripheral portion of the substrate.

Embodiment 3 is devised for overcoming such a problem, and since the peripheral portion of the flowable film is selectively removed in Embodiment 3, the peripheral portion of the substrate can be easily mechanically held.

Now, the first method for selectively removing the peripheral portion of a flowable film 22 will be described with reference to FIGS. 8A through 8C.

Figure 8A:
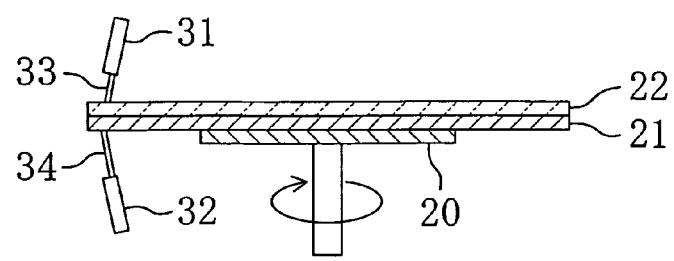
FIGS. 8A through 8C are cross-sectional views for showing procedures in a pattern formation method according to Embodiment 3.

First, as shown in FIG. 8A, after a substrate 21 on which the flowable film 22 is formed is held through vacuum adsorption on a rotatable stage 20, the stage 20 is rotated for rotating the flowable film 22, a release solution 33 is supplied from a first nozzle 31 to the peripheral portion of the flowable film 22 and a release solution 34 is supplied from a second nozzle 32 to the back surface of the peripheral portion of the substrate 21.

Figure 8B:
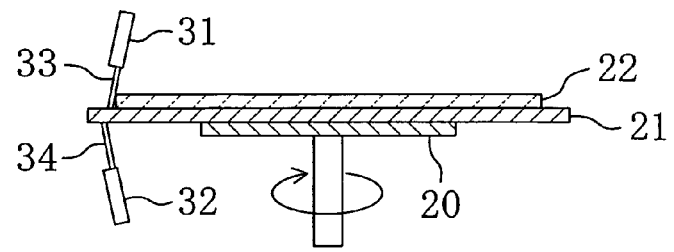
Figure 8C:
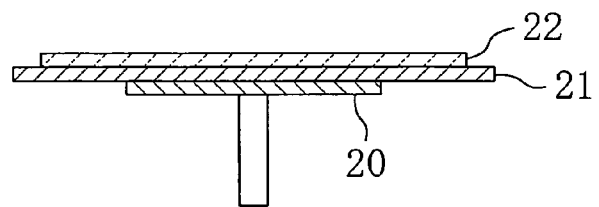

Thus, as shown in FIG. 8B, the peripheral portion of the flowable film 22 can be removed as well as the material with flowability having been adhered onto the peripheral portion of the back surface of the substrate 21 can be removed.

Next, while continuously rotating the stage 20, the supply of the release solutions 33 and 34 is stopped, so as to dry the flowable film 22. In this manner, as shown in FIG. 8C, the flowable film 22 whose peripheral portion has been selectively removed can be obtained.

It is noted that the first method is preferably performed before the transferring process for the flowable film 22.

Since the peripheral portion of the flowable film 22 is removed while rotating the stage 20 together with the flowable film 22 in the first method, this method is suitable when the plane shape of the substrate 21 is in the shape of a circle or a polygon with a large number of vertexes.

Now, the second method for selectively removing the peripheral portion of a flowable film 22 will be described with reference to FIGS. 9A through 9C.

Figure 9A:
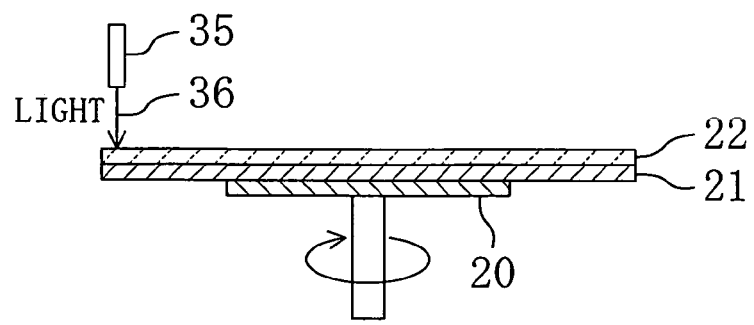
FIGS. 9A through 9C are cross-sectional views for showing other procedures in the pattern formation method of Embodiment 3.

First, as shown in FIG. 9A, after a substrate 21 on which the flowable film 22 is formed is held through vacuum adsorption on a rotatable stage 20, the stage 20 is rotated for rotating the flowable film 22, and the peripheral portion of the flowable film 22 is irradiated with light 36 emitted from a photoirradiation device 35, so as to modify the peripheral portion by causing a photochemical reaction in the peripheral portion (irradiated portion) of the flowable film 22. The light 36 used in this case is preferably UV or light of a shorter wavelength than UV.

Figure 9B:
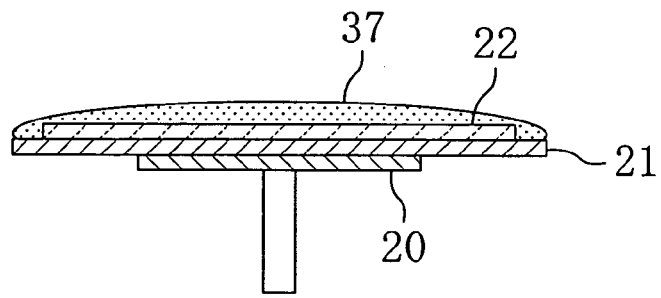

Next, as shown in FIG. 9B, after stopping the rotation of the stage 20 together with the flowable film 22, a solution 37 such as a developer is supplied over the flowable film 22. Thus, the peripheral portion of the flowable film 22 having been modified is dissolved in the solution 37, and hence, the peripheral portion of the flowable film 22 can be selectively removed.

Figure 9C:
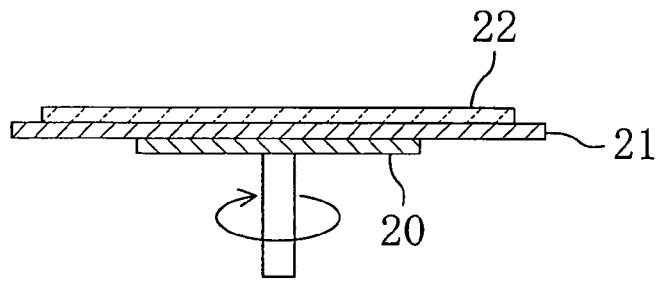

Then, as shown in FIG. 9C, the stage 20 is rotated together with the flowable film 22 again, so as to remove the solution 37 remaining on the flowable film 22 to the outside by using centrifugal force. In this case, while or after removing the solution 37, a rinsing solution is preferably supplied onto the flowable film 22 so as to remove the solution 37 still remaining. In this manner, the flowable film 22 whose peripheral portion has been selectively removed can be obtained.

It is noted that the second method is preferably performed before the transferring process for the flowable film 22.

Since the peripheral portion of the flowable film 22 is selectively irradiated with the light 36 in the second method, this method is applicable not only when the plane shape of the substrate 21 is in the shape of a circle or a polygon with a large number of vertexes but also when it is in the shape of a polygon with a small number of vertexes such as a triangle or a rectangle.

Embodiment 4

A pattern formation method according to Embodiment 4 of the invention will now be described with reference to FIGS. 10A, 10B, 11A and 11B.

In Embodiment 4, a preferable method for transferring the irregularities onto the flowable film obtained in Embodiment 1 or 2 is described, and in this method, a plurality of distances between the surface of the substrate or the stage and the pressing face of the pressing member are measured and the flowable film is pressed in such a manner that these plural distances are equal to one another.

Figure 10A:
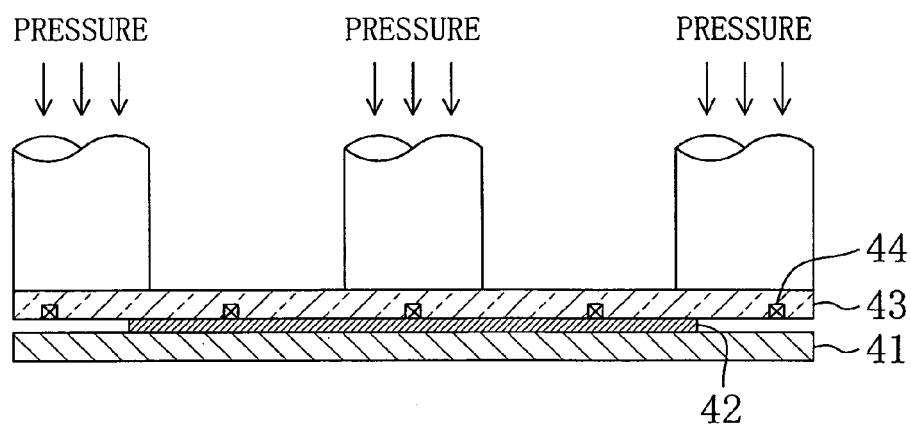
FIGS. 10A and 10B are cross-sectional views for showing procedures in a pattern formation method according to Embodiment 4.

First, as shown in FIG. 10A, after forming a flowable film 42 on a substrate 41 by the method of Embodiment 1 or 2, a pressing member 43 having irregularities and a plurality of distance sensors 44 on its pressing face is used for transferring the irregularities of the pressing member 43 onto the flowable film 42. In Embodiment 4, the outside dimension of the stage 20 (see FIG. 4C or 5B) is preferably larger than that of the substrate 41.

In this case, a plurality of distances between the surface of the substrate 41 or the surface of the stage 20 (see FIG. 4C or 5B) on which the substrate 41 is placed and the pressing face of the pressing member 43 are measured with the plural distance sensors 44, and the irregularities of the pressing member 43 are transferred onto the flowable film 42 by pressing the flowable film 42 with the pressing member 43 in such a manner that the plural distances are equal to one another. Specifically, information of the plural distances measured with the plural distance sensors 44 is fed back to pressing means for pressing the pressing member 43, so that the flowable film 42 can be pressed in such a manner that the plural distances are equal to one another. The feedback control may be executed by using a computer. Also, in measuring the plural distances between the surface of the substrate 41 or the surface of the stage 20 (see FIG. 4C or 5B) on which the substrate 41 is placed and the pressing face of the pressing member 43, each distance is preferably measured by measuring capacitance per unit area in the corresponding measurement position. Thus, the plural distances can be easily and definitely measured.

Now, the method for measuring the plural distances between the surface of the substrate 41 and the pressing face of the pressing member 43 will be described with reference to FIG. 10B.

Figure 10B:
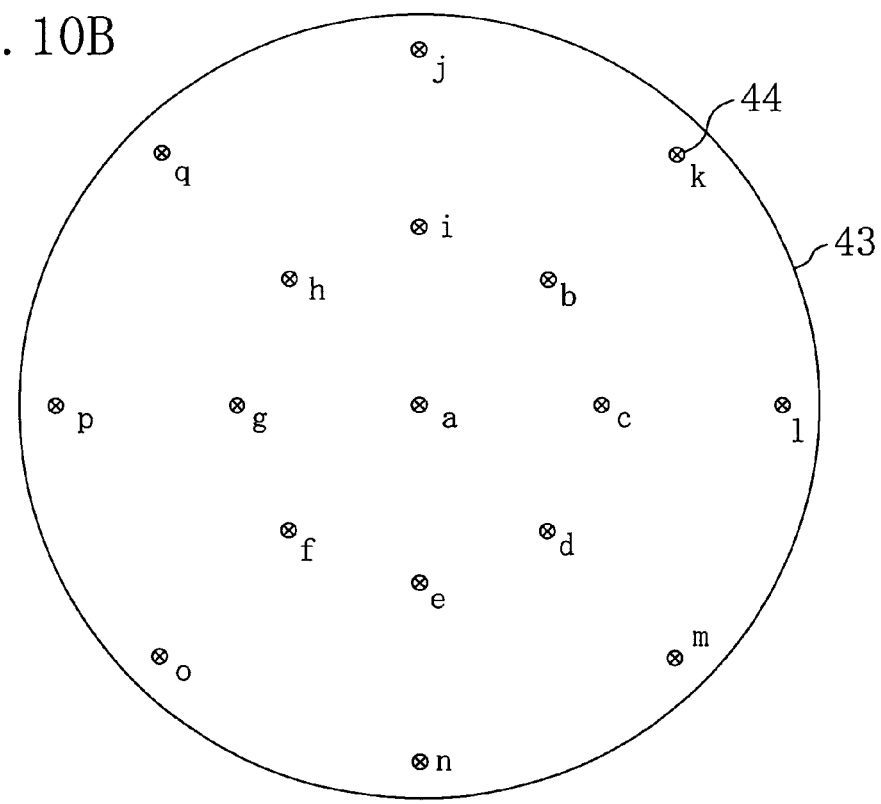

In FIG. 10B, a, b, c, ... and q denote positions where the distance sensors 44 are respectively provided. The positions a through q are preferably optimized in accordance with the mechanism of the pressing member 43 so as to be set to positions where the distances between the surface of the substrate 41 or the surface of the stage where the substrate 41 is placed and the surface of the flowable film 42 can be efficiently measured. For example, the sensor positions a through i at the center are suitable to measure the distances between the surface of the substrate 41 and the surface of the flowable film 42, and the sensor positions j through q in the peripheral portion are suitable to measure the distances between the surface of the stage where the substrate 41 is placed and the surface of the flowable film 42.

Accordingly, merely the distances between the surface of the substrate 41 and the surface of the flowable film 42 may be measured with the distance sensors 44 provided in the sensor positions a through i alone, merely the distances between the surface of the stage where the substrate 41 is placed and the surface of the flowable film 42 may be measured with the distance sensors 44 provided in the sensor positions j through q alone, or the distances between the surface of the substrate 41 and the surface of the flowable film 42 and the distances between the surface of the stage where the substrate 41 is placed and the surface of the flowable film 42 may be measured with the distance sensors 44 provided in the sensor positions a through q.

Alternatively, in the case where the irregularities of the pressing face of the pressing member 44 can be finely adjusted, after the distances between the surface of the substrate 41 and the surface of the flowable film 42 are adjusted with the distance sensors 44 provided in the sensor positions a through i, the distances between the surface of the substrate 41 and the surface of the flowable film 42 may be adjusted with the distance sensors 44 provided in the sensor positions j through q. Thus, more highly accurate flatness can be realized. It is noted that the number and the positions of the distance sensors 44 may be optimized in accordance with a desired degree of flatness.

In Embodiment 1, it is significant but is not easy to equalize a distance of the surface of the flowable film 12A from the surface of the substrate 11. In other words, in Embodiment 1, the distance of the surface of the flowable film 12A from the surface of the substrate 11 can be made uniform by previously setting the distance between the surface of the substrate 11 and the pressing face of the pressing member 13 to be uniform. However, in this method, it is necessary to set the distance between the surface of the substrate 11 and the pressing face of the pressing member 13 to be uniform every given period of time, namely, every time the pressing face of the pressing member 13 has pressed a given number of flowable films 12A.

However, in Embodiment 4, the distance of the surface of the flowable film 42 from the surface of the substrate 41 can be always uniform, and hence, an operation for making the distance between the surface of the substrate 41 and the pressing face of the pressing member 43 uniform every given period of time can be omitted.

The process for adjusting the distance between the surface of the substrate 41 and the pressing face of the pressing member 43 to be uniform may be performed before, while or after pressing the flowable film 42 with the pressing member 43.

Figure 11A:
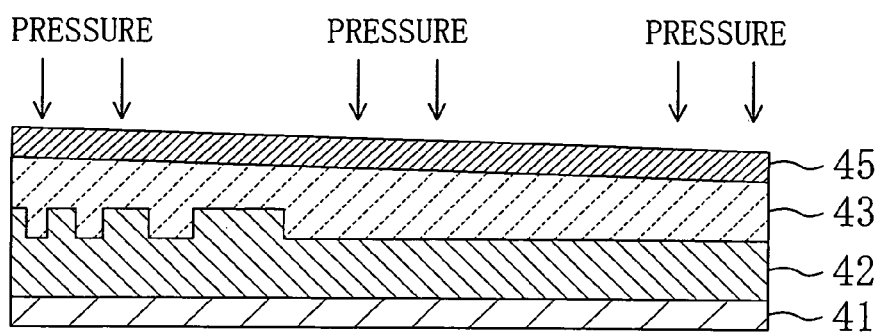
FIGS. 11A and 11B are cross-sectional views for showing other procedures in the pattern formation method of Embodiment 4.
Figure 11B:
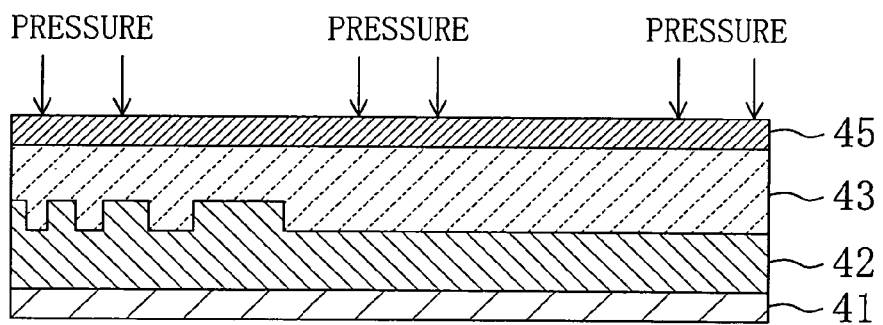

FIG. 11A shows a cross-section of the flowable film 42 obtained when the distance between the pressing face of the pressing member 43 and the surface of the substrate 41 is ununiform, and FIG. 11B shows a cross-section of the flowable film 42 obtained when the distance between the pressing face of the pressing member 43 and the surface of the substrate 41 is kept uniform. In FIGS. 11A and 11B, a reference numeral 45 denotes a pressure plate for applying a pressure to the pressing member 43.

As is understood from comparison between FIGS. 11A and 11B, when the flowable film 42 is pressed with the distance between the pressing face of the pressing member 43 and the surface of the substrate 11 kept uniform, the top face of the flowable film 42 can be planarized with the distance of the flowable film 42 from the surface of the substrate 41 kept uniform.

Embodiment 5

A pattern formation method according to Embodiment 5 will now be described with reference to FIGS. 12A and 12B.

In the method of Embodiment 5, a flowable film 52A is solidified by annealing the flowable film 52A while irradiating it with light.

Figure 12A:
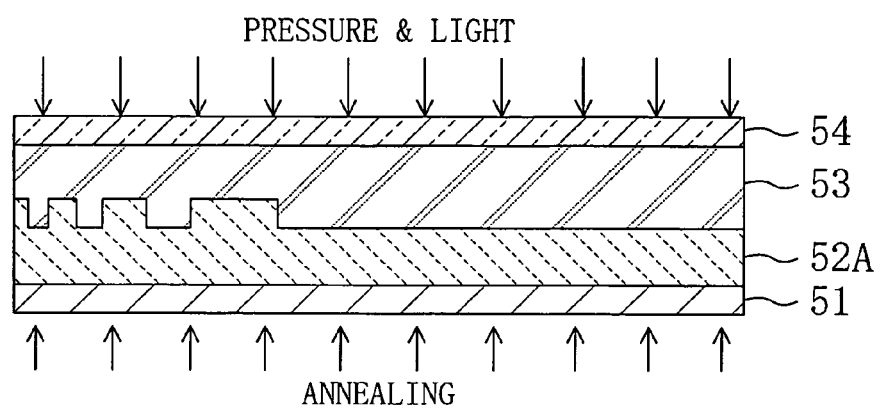
FIGS. 12A and 12B are cross-sectional views for showing procedures in a pattern formation method according to Embodiment 5.

As shown in FIG. 12A, while pressing, with a pressure plate 54, a pressing face of a pressing member 53, which is made of a light transmitting material such as quartz and has irregularities on its pressing face, against the flowable film 52A formed on a substrate 51, so as to transfer the irregularities of the pressing member 53 onto the flowable film 52A, the flowable film 52A is irradiated with light and annealed. The light used for the irradiation is, when the flowable film 52A is solidified principally through a photochemical reaction, preferably UV or light of a shorter wavelength than UV, and when the flowable film 52A is solidified principally through a thermal chemical reaction, preferably infrared light.

Figure 12B:
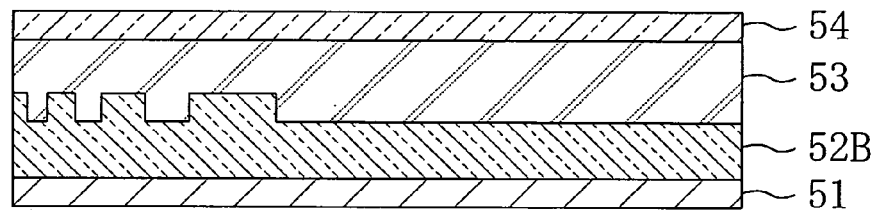

Thus, the flowable film 52A is solidified through the photochemical reaction or the thermal chemical reaction, resulting in giving a solidified film 52B as shown in FIG. 12B.

The method for solidifying the flowable film 52A principally through the photochemical reaction is suitable to a film of a photo-setting resin, such as a photosensitive resin film like a photoresist used in the lithography. Also, the method for solidifying the flowable film 52A principally through the thermal chemical reaction is suitable to an organic film, an organic-inorganic film or an inorganic film made of a chemically amplified material composed of a material for generating an acid or a base through irradiation with light and a base polymer solidified by an acid or a base.

Embodiment 6

A method for forming a semiconductor device according to Embodiment 6 will now be described with reference to FIGS. 13A through 13D and 14A through 14D.

Although not shown in the drawings, after forming an interlayer insulating film on a semiconductor substrate, a lower buried interconnect is formed in an upper portion of the interlayer insulating film, and then, a diffusion preventing film is formed on the lower buried interconnect and the interlayer insulating film. Thus, a substrate 61 having the interlayer insulating film, the lower buried interconnect and the diffusion preventing film on the semiconductor substrate is obtained. In this case, the shape of the substrate 61 is not limited to a plane shape. The diffusion preventing film has a function to prevent a metal included in the lower buried interconnect from diffusing into an insulating film to be formed on the buried interconnect.

Figure 13A:
FIGS. 13A through 13D are cross-sectional views for showing procedures in a method for forming a semiconductor device according to Embodiment 6.

Next, as shown in FIG. 13A, in the same manner as in Embodiment 1, an insulating material with flowability in the form of a liquid or a gel is supplied over the substrate 61 by the spin coating method, the microscopic spraying method, the rotation roller method or the like, so as to form a flowable film 62A having an insulating property. The thickness of the flowable film 62A can be appropriately set.

The flowable film 62A may be any of the insulating films described in Embodiment 1, namely, an organic film, an inorganic film, an organic-inorganic film or a porous film. When such an insulating film is used, the resultant insulating film attains a lower dielectric constant than a general silicon oxide film, and thus, an insulating film suitable to a semiconductor device refined to 100 nm or less can be realized. In particular, when a porous film is used, an insulating film with a very low dielectric constant of 2 or less can be realized.

Figure 13B:
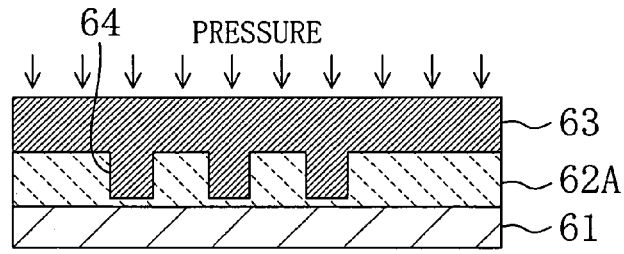

Next, as shown in FIG. 13B, after a pressing member 63 having a pressing face with convex portions 64 in the shape of dots or lines is brought into contact with the surface of the flowable film 62A, a pressure is applied to the pressing member 63 so as to transfer the convex portions 64 onto the surface of the flowable film 62A for forming concave portions thereon and to planarize the top face of the flowable film 62A excluding the concave portions. In other words, the top face excluding the concave portions of the flowable film 62A is made to be placed at the uniform height from the surface of the substrate 61.

Figure 13C:
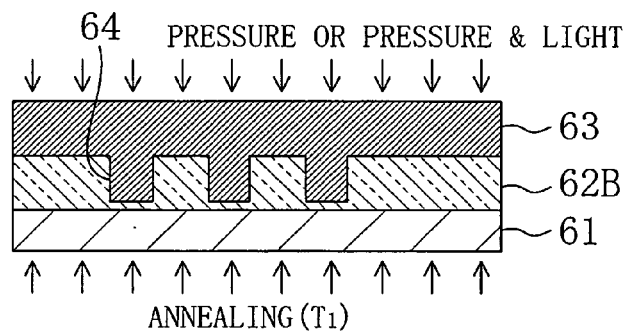

Then, as shown in FIG. 13C, the substrate 61 together with the flowable film 62A are annealed at a first temperature (T1) so as to cause a thermal chemical reaction in the insulating material. Thus, the flowable film 62A is solidified to form a solidified film 62B with the concave portions. In the solidifying process, any of the methods of Embodiments 1 through 4 suitable to the characteristics of the flowable film 62A may be selected.

Figure 13D:
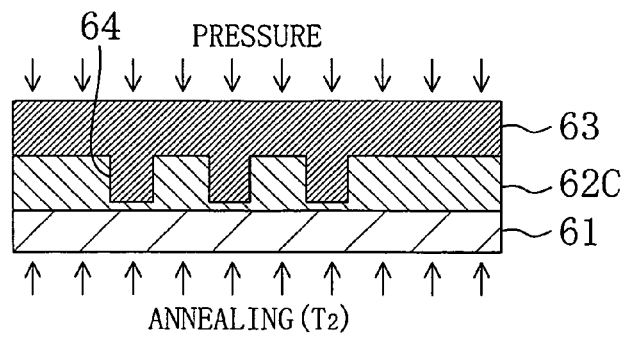
Figure 14A:
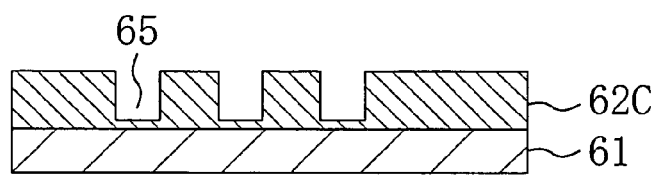
FIGS. 14A through 14D are cross-sectional views for showing other procedures in the method for forming a semiconductor device of Embodiment 6.

Next, as shown in FIG. 13D, in the same manner as in Embodiments 1 and 2, the solidified film 62B is annealed at a second temperature (T2) higher than the first temperature (T1) for burning the solidified film 62B, so as to form a pattern 62C. Thereafter, after the temperature of the pattern 62C is lowered to a temperature range from approximately 100° C. to room temperature, the pressing member 63 is moved away from the pattern 62C and the temperature of the pattern 62C is lowered ultimately to room temperature. In this manner, as shown in FIG. 14A, the pattern 62C having concave portions 65 in the shape of a hole or groove and having a flat top face excluding the concave portions 65 is obtained.

Figure 14B:
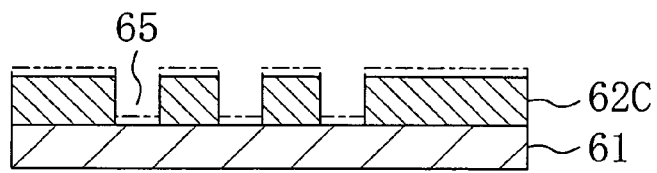

Then, as shown in FIG. 14B, the pattern 62C is subjected to etch back process by dry etching. Thus, portions of the pattern 62C remaining on the bottoms of the concave portions 65 are removed through the etch back process, and hence, holes or interconnect grooves corresponding to the concave portions 65 are obtained. This etch back process is preferably anisotropic dry etching. Thus, the dimensional change of the pattern 62C can be suppressed to be minimum and the pattern 62C having the holes or interconnect grooves in a good shape can be realized.

Thereafter, the diffusion preventing film (not shown in the drawing) is subjected to the anisotropic dry etching, so as to expose the upper face of the lower metal interconnect (not shown in the drawing) formed below the diffusion preventing film. Through the etch back process and the dry etching of the diffusion preventing film, the lower metal interconnect is exposed in the concave portions 65 corresponding to the holes or interconnect grooves.

In the case where the pattern 62C is made of an insulating film apart from an organic film, an etching gas for use in the etch back process may be a gas including fluorine such as a $CF_4$ gas or a $CHF_3$ gas, a mixed gas of a gas including fluorine and an oxygen gas, an ammonia gas or the like. In the case where the pattern 62C is made of an organic film, the etching gas may be a mixed gas of an oxygen gas and a nitrogen gas, a mixed gas of a nitrogen gas and a hydrogen gas, an ammonia gas or the like.

Figure 14C:
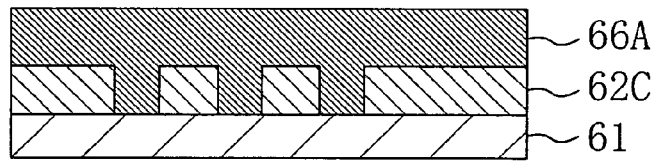

Next, as shown in FIG. 14C, a metal film 66A is deposited over the pattern 62C having the concave portions 65 corresponding to the holes or interconnect grooves so as to fill the concave portions 65. In general, before depositing the metal film 66A, a barrier metal layer of Ta or TaN is deposited on the concave portions 65 by the sputtering, the CVD or the like. Also, the metal film 66A is deposited by the plating method using, as a seed, a seed layer previously formed by the sputtering. It is noted that the metal film 66A may be deposited by the CVD instead of the plating method. Copper is generally used as the metal film 66A, and apart from copper, metal that can be deposited by the plating method and has low resistance, such as gold, silver or platinum, is preferably used.

Figure 14D:
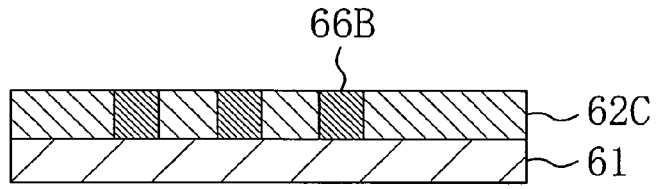

Then, as shown in FIG. 14D, an unnecessary portion of the metal film 66A, namely, a portion thereof exposed above the pattern 62C, is removed by the CMP. Thus, a plug or an upper metal interconnect 66B made of the metal film 66A is formed in each concave portion 65.

In Embodiment 6, when the convex portions 64 provided on the pressing face of the pressing member 63 are in the shape of columns (dots), the concave portions 65 corresponding to holes are formed in the pattern 62C, and when the convex portions 64 are in the shape of lines, the concave portions 65 corresponding to interconnect grooves are formed in the pattern 62C. Therefore, the plug or upper metal interconnect 66B can be formed in the pattern 62C by the single damascene method.

Although not shown in the drawings, when the aforementioned procedures are repeated, a multilayered interconnect structure including, in each layer, the interlayer insulating film of the pattern 62C and the plug or upper metal interconnect 66B can be formed.

Since the interlayer insulating film made of the pattern 62C with no global level difference can be formed in Embodiment 6, local concentration of film stress can be released, resulting in improving the reliability of the multilayered interconnects.

Also, in the case where a mask pattern is formed on the interlayer insulating film made of the pattern 62C by the lithography, degradation of a focal depth margin derived from a level difference can be suppressed. Therefore, as compared with conventional technique, a process margin (process window) can be increased, resulting in forming a highly accurate semiconductor device.

In the case where a film largely outgassing in the burning process is used as the flowable film 62A in Embodiment 6, the burning process of Embodiment 2 is more effectively employed than that of Embodiment 1. In the case where the flowable film 62A is made of a general film, the concentration of a solvent remaining in the film can be controlled through the pre-bake, and hence, the film minimally outgases in the burning process. However, the film may largely outgas in the burning process where the film is annealed at a comparatively high temperature depending upon its composition in some cases. In such a case, when the burning process of Embodiment 1 is employed, there arises a problem of uniformity or stability in the pattern 62C, and hence, the burning process of Embodiment 2 is preferably employed.

In particular, when the pattern 62C is made of a porous film, the burning process of Embodiment 2 is effectively employed. In a porous film, most of the basic structure of the film is formed in the solidifying process, and a pore forming material added for forming pores is evaporated in the following burning process. Therefore, the burning process of Embodiment 2 where the film is burnt with the pressing member 63 moved away from the solidified film 62B is suitable. However, even in using a porous film, when a material in which the basic skeleton of the film is formed and a pore forming material is vaporized simultaneously in the solidifying process is used, a good pattern 62C can be obtained even by employing the burning process of Embodiment 1.

Since the pattern 62C is used as an insulating film of a semiconductor device in Embodiment 6, the annealing temperature of the solidifying process (the first temperature) is preferably approximately 150° C. through 300° C., and the annealing temperature of the burning process (the second temperature) is preferably approximately 350° C. through 450° C.

Embodiment 7

A method for forming a semiconductor device according to Embodiment 7 will now be described with reference to FIGS. 15A through 15D and 16A through 16D.

Although not shown in the drawings, after forming an interlayer insulating film on a semiconductor substrate, a lower buried interconnect is formed in an upper portion of the interlayer insulating film, and then, a diffusion preventing film is formed on the lower buried interconnect and the interlayer insulating film. Thus, a substrate 71 having the interlayer insulating film, the lower buried interconnect and the diffusion preventing film on the semiconductor substrate is obtained. In this case, the shape of the substrate 71 is not limited to a plane shape.

Figure 15A:
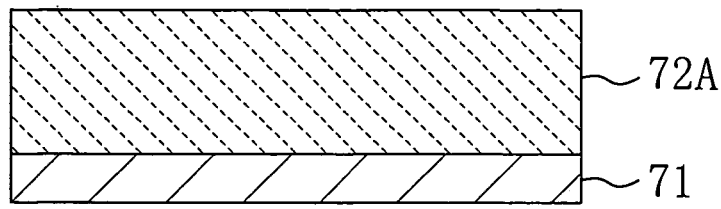
FIGS. 15A through 15D are cross-sectional views for showing procedures in a method for forming a semiconductor device according to Embodiment 7.

Next, as shown in FIG. 15A, in the same manner as in Embodiment 1, an insulating material with flowability in the form of a liquid or a gel is supplied over the substrate 71 by the spin coating method, the microscopic spraying method, the rotation roller method or the like, so as to form a flowable film 72A having an insulating property. The flowable film 72A may be any of the insulating films described in Embodiment 1, namely, an organic film, an inorganic film, an organic-inorganic film or a porous film.

Figure 15B:
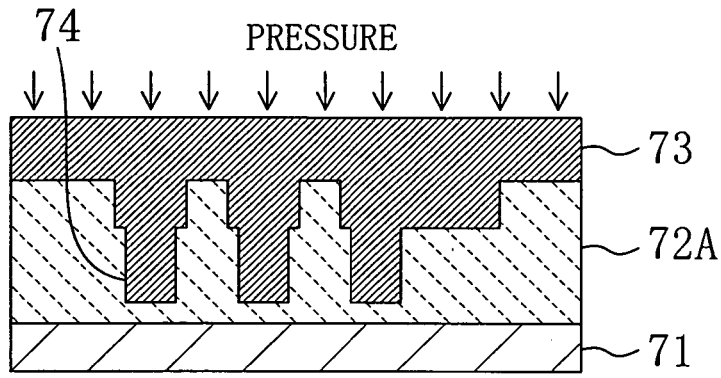

Next, as shown in FIG. 15B, after a pressing member 73 having a pressing face with convex portions 74 in the shape of lines having dots thereon is brought into contact with the surface of the flowable film 72A, a pressure is applied to the pressing member 73 so as to transfer the convex portions 74 onto the surface of the flowable film 72A for forming concave portions thereon and to planarize the top face excluding the concave portions.

Figure 15C:
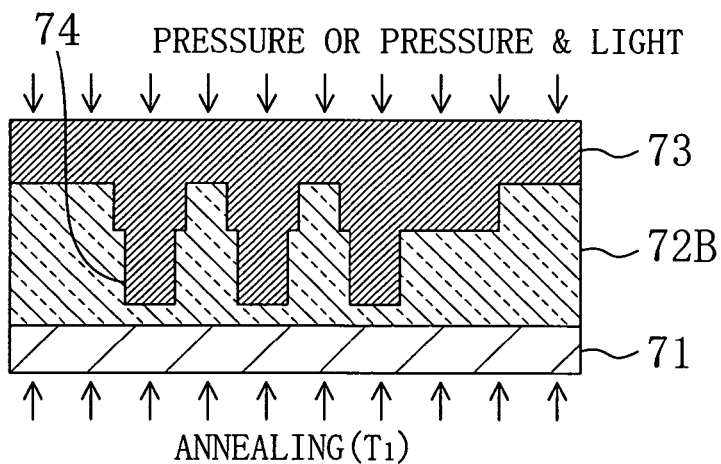

Then, as shown in FIG. 15C, the substrate 71 together with the flowable film 72A are annealed at a first temperature (T1) so as to cause a thermal chemical reaction in the insulating material. Thus, the flowable film 72A is solidified to form a solidified film 72B with the concave portions. In the solidifying process, any of the methods of Embodiments 1 through 4 suitable to the characteristics of the flowable film 72A may be selected.

Figure 15D:
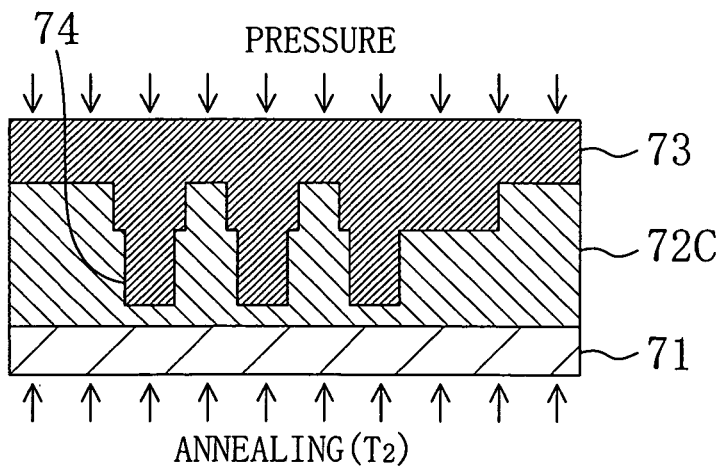
Figure 16A:
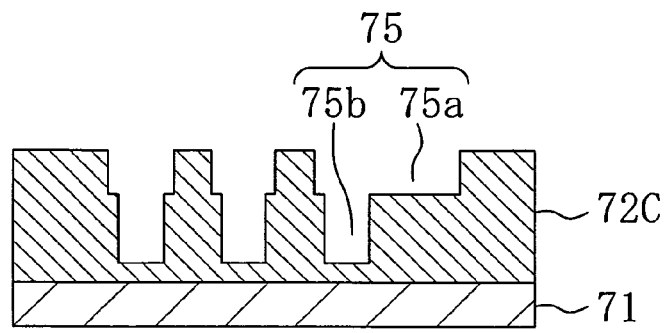
FIGS. 16A through 16D are cross-sectional views for showing other procedures in the method for forming a semiconductor device of Embodiment 7.

Next, as shown in FIG. 15D, in the same manner as in Embodiments 1 and 2, the solidified film 72B is annealed at a second temperature (T2) higher than the first temperature (T1) for burning the solidified film 72B, so as to form a pattern 72C. Thereafter, after the temperature of the pattern 72C is lowered to a temperature range from approximately 100° C. to room temperature, the pressing member 73 is moved away from the pattern 72C and the temperature of the pattern 72C is lowered ultimately to room temperature. In this manner, as shown in FIG. 16A, the pattern 72C having concave portions 75 consisting of interconnect grooves 75a and holes 75b present below the interconnect grooves 75a and having a flat top face excluding the concave portions 75 is obtained.

Figure 16B:
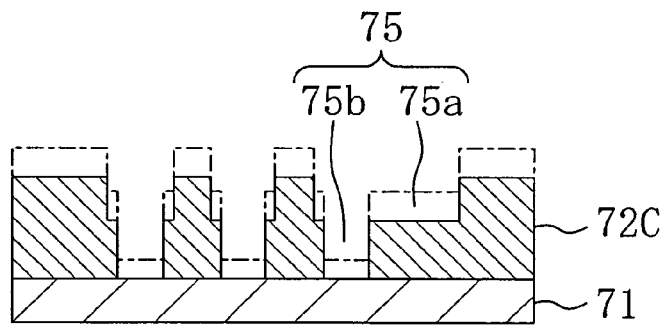

Then, as shown in FIG. 16B, the pattern 72C is subjected to etch back process by dry etching. Thus, portions of the pattern 72C remaining on the bottoms of the concave portions 75 are removed through the etch back process, and hence, the concave portions 75 integrally consisting of the interconnect grooves 75a and the holes 75b are obtained.

Thereafter, the diffusion preventing film (not shown in the drawing) is subjected to the anisotropic dry etching, so as to expose the upper face of the lower metal interconnect (not shown in the drawing) formed below the diffusion preventing film. Through the etch back process and the dry etching of the diffusion preventing film, the lower metal interconnect is exposed in the concave portions 75 consisting of the interconnect grooves 75a and the holes 75b.

Figure 16C:
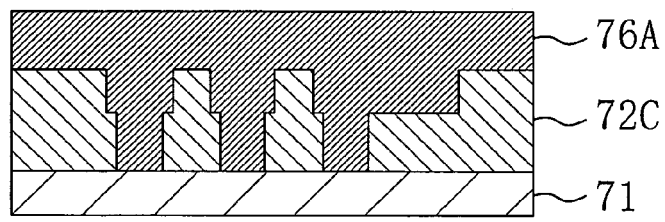

Next, as shown in FIG. 16C, a metal film 76A is deposited over the pattern 72C having the concave portions 75 so as to fill the concave portions 75. In general, before depositing the metal film 76A, a barrier metal layer of Ta or TaN is deposited on the concave portions 75 by the sputtering, the CVD or the like.

Figure 16D:
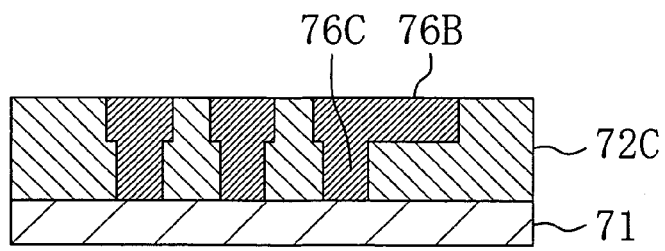
Figure 17A:
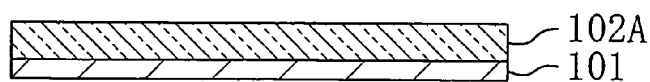
FIGS. 17A through 17E are cross-sectional views for showing procedures in a pattern formation method according to a first conventional example.
Figure 17B:
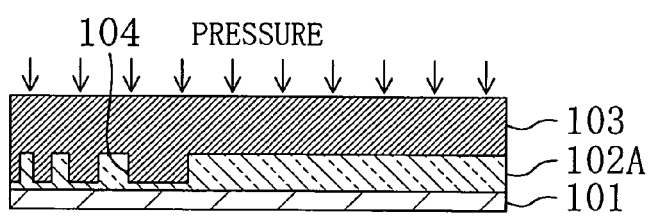
Figure 17C:
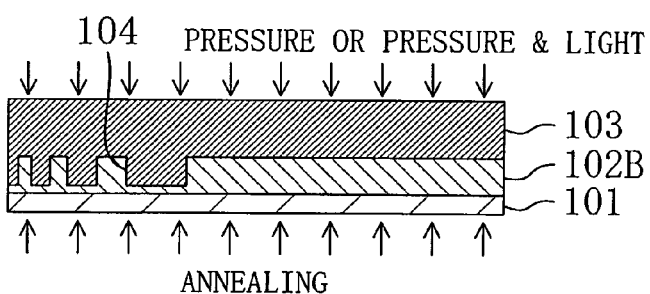
Figure 17D:
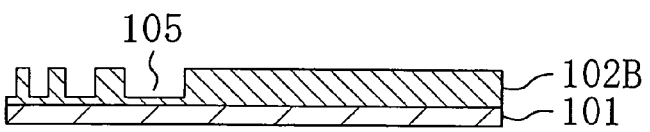
Figure 17E:
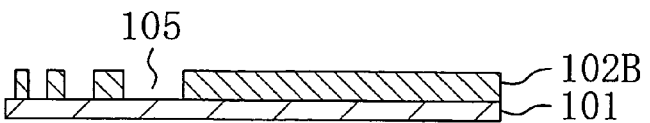
Figure 18A:
FIGS. 18A through 18E are cross-sectional views for showing procedures in a method for forming a semiconductor device according to a second conventional example.
Figure 18B:
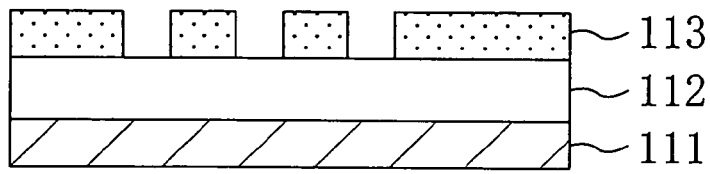
Figure 18C:
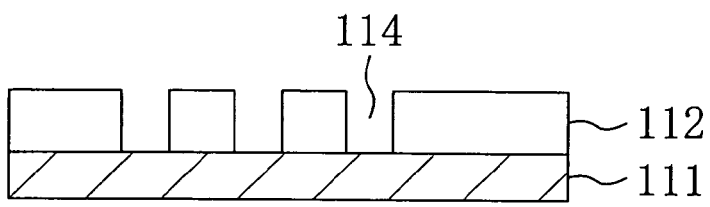
Figure 18D:
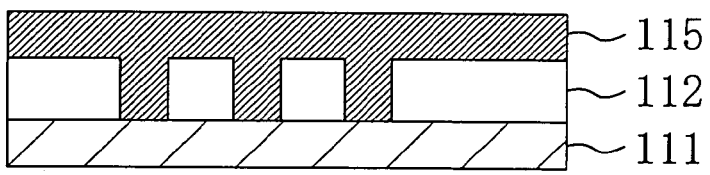
Figure 18E:
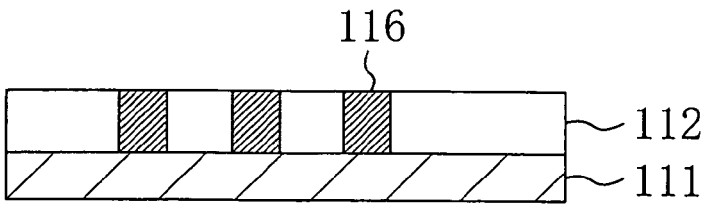
Figure 19A:
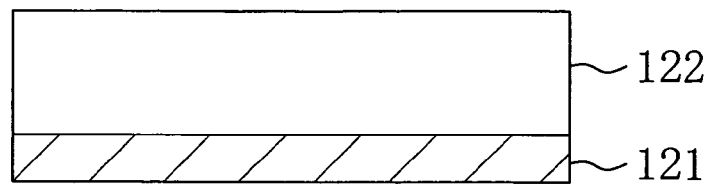
FIGS. 19A through 19D are cross-sectional views for showing procedures in a method for forming a semiconductor device according to a third conventional example.
Figure 19B:
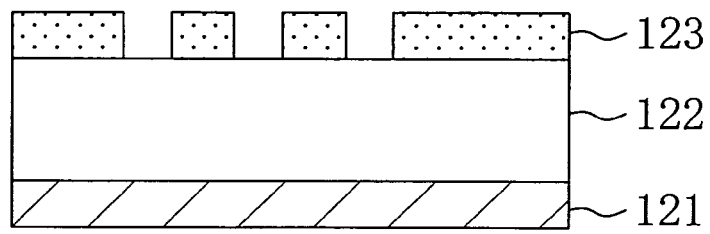
Figure 19C:
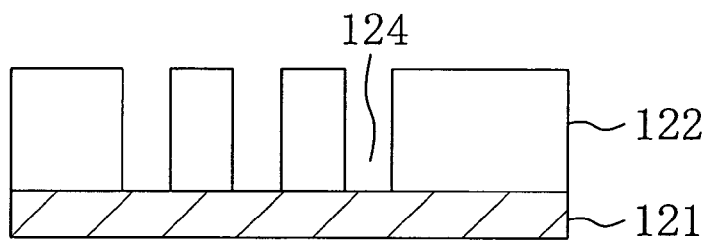
Figure 19D:
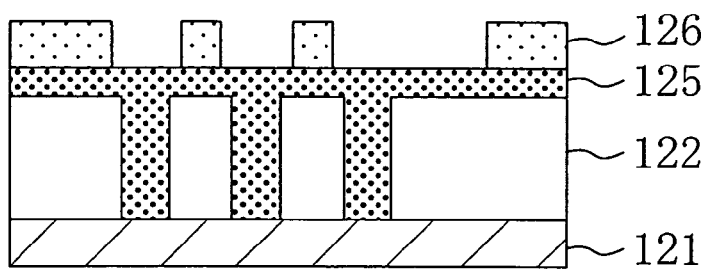
Figure 20A:
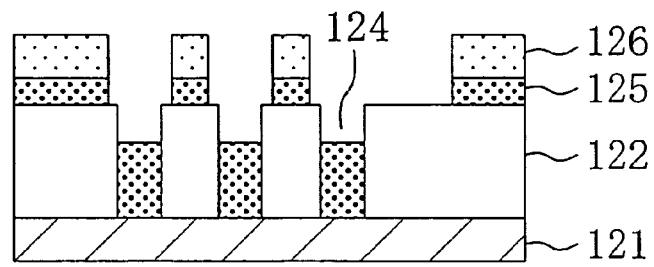
FIGS. 20A through 20D are cross-sectional views for showing other procedures in the method for forming a semiconductor device of the third conventional example.
Figure 20B:
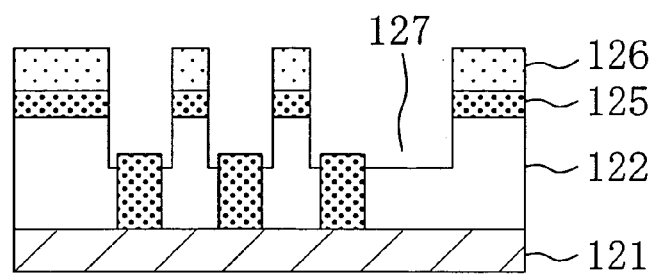
Figure 20C:
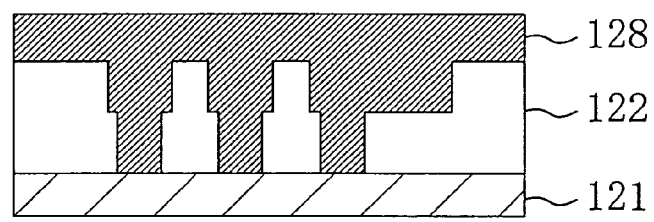
Figure 20D:
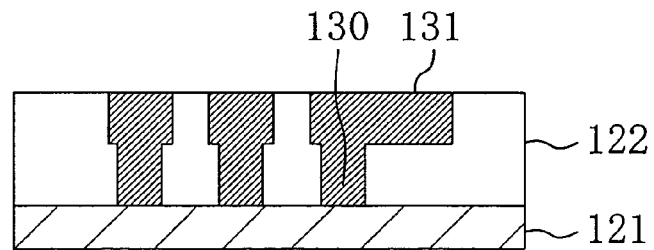

Then, as shown in FIG. 16D, an unnecessary portion of the metal film 76A, namely, a portion thereof exposed above the pattern 72C, is removed by the CMP. Thus, upper metal interconnects 76B and plugs 76C made of the metal film 76A are formed in the concave portions 75.

In Embodiment 7, since the convex portions 74 provided on the pressing face of the pressing member 73 are in the shape of lines and dots, the concave portions 75 consisting of the interconnect grooves 75a and the holes 75b are formed in the pattern 72C. Therefore, the upper metal interconnects 76B and the plugs 76C can be formed by the dual damascene method.

Although not shown in the drawings, when the aforementioned procedures are repeated, a multilayered interconnect structure including, in each layer, the interlayer insulating film of the pattern 72C, the upper metal interconnects 76B and the plugs 76C can be formed.

What is claimed is:

1. A method for forming a semiconductor device comprising the steps of:
    forming a flowable film made of an insulating material with flowability;
    forming a convex portion provided on a pressing face of a pressing member onto said flowable film by pressing said pressing member against said flowable film;
    forming a solidified film by solidifying said flowable film, onto which said convex portion has been transferred, through annealing at a first temperature with said pressing member pressed against said flowable film;
    forming a pattern having a concave portion in the shape corresponding to said convex portion and made of said solidified film burnt by annealing at a second temperature higher than said first temperature; and
    forming at least one of a metal interconnect and a plug by filling said concave portion with a conductive material.

2. The method for forming a semiconductor device of claim 1,
    wherein said first temperature is approximately 150° C. through approximately 300° C.

3. The method for forming a semiconductor device of claim 1,
    wherein said second temperature is approximately 350° C. through approximately 450° C.

4. The method for forming a semiconductor device of claim 1,
    wherein said material with flowability is a photo-setting resin, and
    the step of forming a flowable film includes a sub-step of irradiating said flowable film with light.

5. The method for forming a semiconductor device of claim 1, wherein said material with flowability is an organic material, an inorganic material, an organic-inorganic material, a photo-setting resin or a photosensitive resin.

6. The method for forming a semiconductor device of claim 1,
wherein in the step of forming a pattern, said solidified film is annealed at said second temperature with said pressing face pressed against said solidified film.

7. The method for forming a semiconductor device of claim 1,
wherein in the step of forming a pattern, said solidified film is annealed at said second temperature with said pressing face moved away from said solidified film.

8. The method for forming a semiconductor device of claim 1,
wherein said pattern is a porous film.

9. The method for forming a semiconductor device of claim 1,
wherein said pattern has a dielectric constant of approximately 4 or less.

10. The method for forming a semiconductor device of claim 1, further comprising, after the step of forming a pattern and before the step of forming at least one of a metal interconnect and a plug, a step of removing a portion of said pattern remaining on a bottom of said concave portion by etching.

* * * * *

UNITED STATES PATENT AND TRADEMARK OFFICE
CERTIFICATE OF CORRECTION

PATENT NO. : 7,294,571 B2
APPLICATION NO. : 11/098371
DATED : November 13, 2007
INVENTOR(S) : Hideo Nakagawa et al.

Page 1 of 1

It is certified that error appears in the above-identified patent and that said Letters Patent is hereby corrected as shown below:

On the title page and col. 1, lines 1-3, item "(54) Title", please change "CONCAVE PATTERN FORMATION METHOD AND METHOD FOR FORMING SEMICONDUCTOR DEVICE" to --PATTERN FORMATION METHOD AND METHOD FOR FORMING SEMICONDUCTOR DEVICE--; and On the title page, in item "(56) References Cited", under "OTHER PUBLICATIONS", change "Chou, Stephen Y., et al., "Imprint of sub-25 nm vias and trenches in polymers." Appl. Phys. Lett. 67(21), Nov. 20, 1995, pp. 3114-3115" to --Chou, Stephen Y., et al., "Imprint of sub-25 nm vias and trenches in polymers." Appl. Phys. Lett. 67(21), Nov. 20, 1995, pp. 3114-3116--.

Signed and Sealed this

Twelfth Day of August, 2008

JON W. DUDAS
*Director of the United States Patent and Trademark Office*